(12) United States Patent
Cooke

(10) Patent No.: US 8,433,170 B2
(45) Date of Patent: Apr. 30, 2013

(54) ALL-OPTICAL CONTROL OF THZ RADIATION IN PARALLEL PLATE WAVEGUIDES

(75) Inventor: David Gregory Cooke, Westmount (DK)

(73) Assignee: Danmarks Tekniske Universitet, Lyngby (DK)

( * ) Notice: Subject to any disclaimer, the term of this patent is extended or adjusted under 35 U.S.C. 154(b) by 274 days.

(21) Appl. No.: 13/000,773

(22) PCT Filed: Apr. 30, 2009

(86) PCT No.: PCT/DK2009/050101
§ 371 (c)(1),
(2), (4) Date: Feb. 1, 2011

(87) PCT Pub. No.: WO2010/006611
PCT Pub. Date: Jan. 21, 2010

(65) Prior Publication Data
US 2011/0114856 A1    May 19, 2011

Related U.S. Application Data

(60) Provisional application No. 61/080,854, filed on Jul. 15, 2008.

(30) Foreign Application Priority Data

Jul. 15, 2008 (EP) ........................... 8160432

(51) Int. Cl.
*G02B 6/10* (2006.01)
(52) U.S. Cl.
USPC .......................................................... 385/129
(58) Field of Classification Search ............ None
See application file for complete search history.

(56) References Cited

U.S. PATENT DOCUMENTS

| 4,941,725 A | 7/1990 | Normandin |
| 6,075,640 A | 6/2000 | Nelson |

(Continued)

FOREIGN PATENT DOCUMENTS

| JP | 2006-71801 | 3/2006 |
| WO | WO 2006/123153 A1 | 11/2006 |

OTHER PUBLICATIONS

Amarasinghe, D. et al., "Broadband solid state optical amplifier based on a semiconducting polymer" Applied Physics Letters, 2006, pp. 201119-201119-3, vol. 89.

(Continued)

*Primary Examiner* — Sarah Hahm
(74) *Attorney, Agent, or Firm* — Knobbe Martens Olson & Bear LLP

(57) ABSTRACT

The invention relates to control of THz radiation in parallel plate waveguides (PPWG) by forming components in the waveguide by use of optical radiation pulses. Patterns of excited regions induced in the PPWG by an optical excitation pulses changes the electromagnetic properties of the waveguide medium in the THz regime, thereby forming transient passive and active components for controlling THz radiation signals. The excitation can be generation of free charge carriers in a semiconductor material in the PPWG, to create metallic regions that form mirrors, lenses or photonic crystal structures in the PPWG. The photo-induced pattern can be modulated in time in response to an incoming signal, to frequency-, phase- or amplitude-modulate the THz signal. The systems can be integrated on chip-scale components and can be applied in e.g. THz communication, digital computing, sensors, and lab-on-a-chip applications. The optical and THz radiation can be ultrashort pulses with picosecond or femtosecond pulse durations.

15 Claims, 16 Drawing Sheets

U.S. PATENT DOCUMENTS

| | | |
|---|---|---|
| 6,684,008 B2 | 1/2004 | Young et al. |
| 2002/0036299 A1 | 3/2002 | Young et al. |
| 2003/0202728 A1 | 10/2003 | Leonard et al. |
| 2004/0133377 A1 | 7/2004 | Schweikert et al. |
| 2006/0165360 A1 | 7/2006 | Siegel et al. |
| 2007/0269176 A1 | 11/2007 | Mitomi et al. |
| 2007/0269178 A1 | 11/2007 | Sarukura et al. |

OTHER PUBLICATIONS

Bingham, Adam et al., "THz parallel plate photonic waveguides" Applied Physics Letters, 2005, pp. 051101-051101-3, vol. 87.

Cheng, Z.Y. et al., "Optically activated integrated optic Mach-Zenhnder interferometer on GaAs" Applied Physics Letters, Oct. 28, 1991, pp. 2222-2224, vol. 59, No. 18.

Cooke, D.G. et al., "Optical modulation of terahertz pulses in a parallel plate waveguide" Optics Express, Sep. 15, 2008, vol. 16, No. 19.

Cooke, David G. et al., "Time-resolved THz spectroscopy in a parallel plate waveguide" Phys. Status Solidi, 2009, pp. 997-1000, vol. 206, No. 5.

Fekete, L. et al., "Ultrafast opto-terahertz photonic crystal modulator" Optics Letters, Mar. 15, 2007, pp. 680-682, vol. 32, No. 6.

Kasherininov, P.G. et al., "Light-Controlled Optical Elements for Optical Processing of Information and the Fiber-Optic Links" Telecommunications and Radio Engineering, Nov. 1990, pp. 71-75, vol. 45, No. 11.

Laman, N. et al., "Missing Conductivity in the THz Skin-Depth Layer of Metals" School of Electrical and Computer Engineering, Oklahoma State University, Stillwater, Oklahoma, 2007.

Mendis R., et al., "Undistorted guided-wave propagation of subpicosecond terahertz pulses" Optics Letters, Jun. 1, 2001, pp. 846-848, vol. 26, No. 11.

Mendis, Rajind "THz transmission characteristics of dielectric-filled parallel-plate waveguides" Journal of Applied Physics, 2007, pp. 083115-083115-4, vol. 101.

Zhao, Yuguang et al., "A New Method for the Realization of a Tunable Terahertz Photonic Bandgap" School of Electrical and Computer Engineering, Oklahoma State University, Stillwater, Oklahoma, 2007.

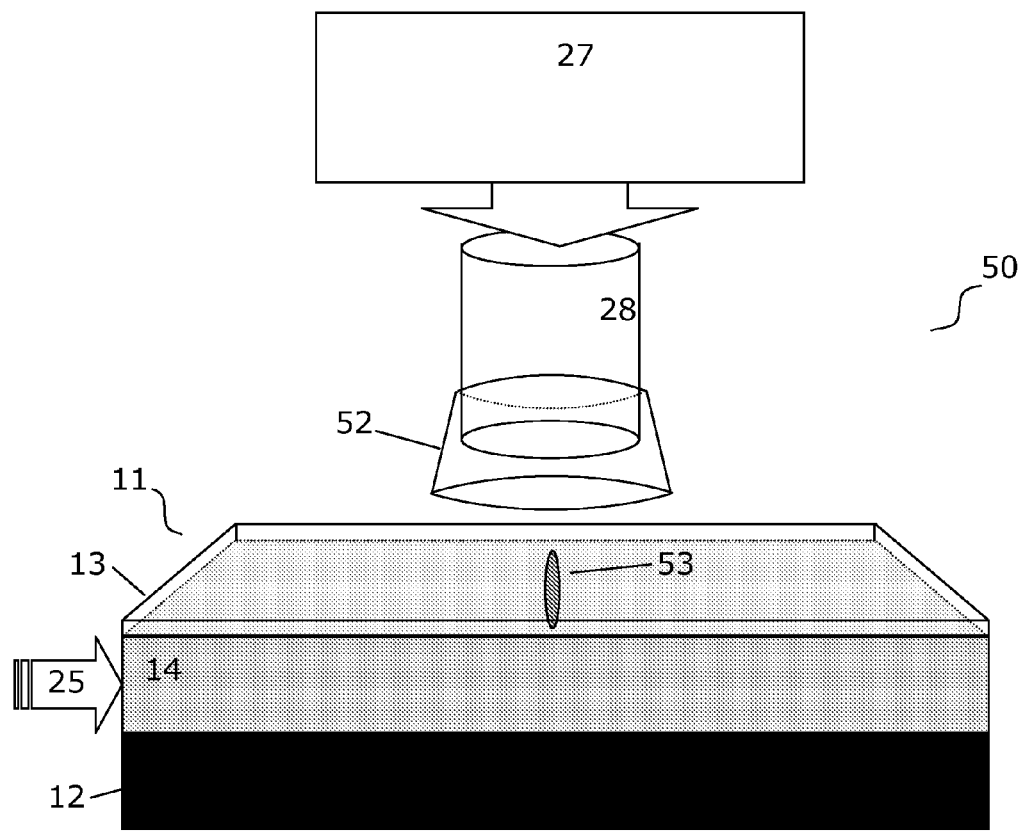
Fig. 5
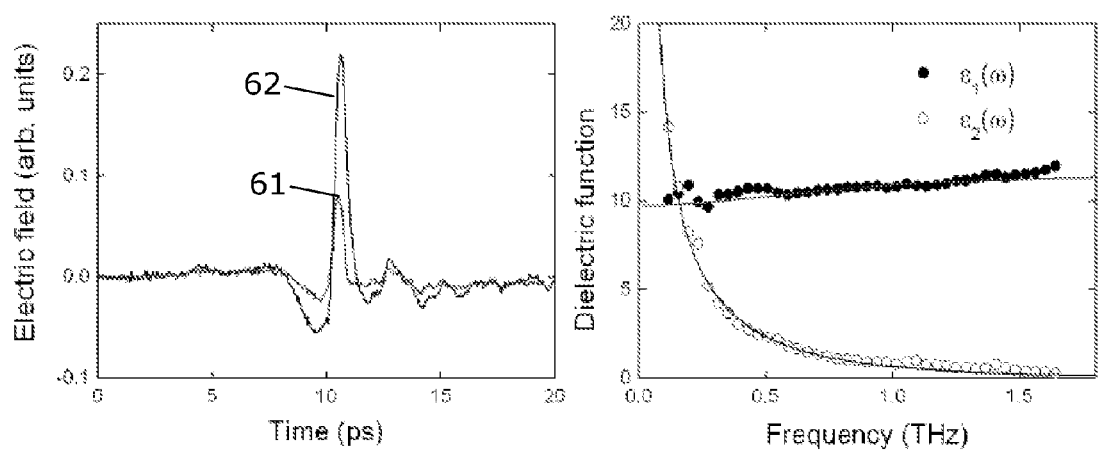
Fig. 6A
Fig. 6B

ALL-OPTICAL CONTROL OF THz RADIATION IN PARALLEL PLATE WAVEGUIDES

CROSS REFERENCE TO RELATED APPLICATIONS

This application claims the benefit and priority to and is a U.S. National Phase Application of PCT International Application Number PCT/DK2009/050101, filed on Apr. 30, 2009, designating the United States of America and published in the English language, which is an International Application of and claims the benefit of priority to European Patent Application No. 08160432.4, filed on Jul. 15, 2008, and U.S. Provisional Application No. 61/080,854, filed on Jul. 15, 2008. The disclosures of the above-referenced applications are hereby expressly incorporated by reference in their entireties.

FIELD OF THE INVENTION

The present invention relates to controlling of electromagnetic radiation with frequencies in the THz regime, and more particularly to controlling such radiation in parallel plate waveguides by forming components in the waveguide by use of optical radiation.

BACKGROUND OF THE INVENTION

THz radiation, the high frequency end of the microwave (MW) band, is presently believed to be a potential candidate for future short distance high speed wireless connections, e.g. as a replacement for Bluetooth technology. Other interesting applications are in lab-on-a-chip applications as well as in all optical computing.

Typically, THz radiation is formed and applied as pulsed radiation, often generated from ultrashort laser pulses, hence, THz pulses are often in the picosecond (ps) or sub-picosecond (subps) range.

For this reason, pulse broadening due to group-velocity-dispersion (GVD) plays an important role when trying to propagate THz pulses in waveguides.

Parallel plate waveguides (PPWG) have been shown to induce only little pulse broadening and furthermore providing efficient quasi-optic coupling of freely propagating THz pulses, see e.g. "Undistorted guided-wave propagation of subpicosecond THz pulses", Mendis et. al, Opt. Lett. 26, 846 (2001).

For the purpose of controlling THz pulses in PPWGs, integration of various components have been suggested, such as a photonic waveguide stop bands and transmission bands, see "THz parallel plate photonic waveguides", Bingham et. al, Appl. Phys. Lett. 87, 051101 (2005) and references therein.

A metal waveguide that can be used in a THz laser or amplifier is described in US patent application No. 2005/058166.

The implicit simplicity of the structure of PPWGs makes them suitable for integration on integrated circuits and MEMS devices, such as chips and structures based on silicon and photolithography technology. Hence, ways of controlling THz radiation in PPWGs would be advantageous, and in particular ways that also allow such integration would be advantageous.

JP 2006071801 relates to coupling of THz radiation in/out of a THz waveguide. Photo-induced free carriers are induced in a semiconductor slab waveguide based on total internal reflection in a Si layer sandwiched by quartz and air, possibly with a microstrip transmission line. The induced free carriers serves to couple THz in/out of the waveguide or to absorb the radiation.

Also, the high frequency (as compared to electrical signals) and ultrashort nature of THz pulses makes them if interest to high speed data transmission, and therefore active components that can be used for this purpose would be advantageous.

SUMMARY OF THE INVENTION

Accordingly, the invention preferably seeks to mitigate, alleviate or eliminate one or more of the above mentioned disadvantages singly or in any combination. In particular, it may be seen as an object of the present invention to provide a method and a system for controlling THz radiation in a PPWG that solves the above mentioned problems of the prior art with This object and several other objects are obtained in a first embodiment of the invention by providing a system for controlling THz radiation in a PPWG, comprising:

- a THz PPWG comprising parallel first and second electrically conducting layers and a semiconductor layer disposed between the first and second conducting layers, wherein one or more parts of one of the conducting layers is transparent to optical radiation;
- an optical radiation source for generating an excitation beam for irradiating the semiconductor layer through the transparent conducting layer parts, the optical radiation being capable of generating free charge carriers through the entire thickness of the semiconductor layer; and
- one or more beam shaping elements for controlling the excitation beam to create a photo-induced pattern of charge carriers in the semiconductor layer for controlling THz radiation propagating in the PPWG;
- the optical radiation source and beam shaping means being configured to generate transient photo-induced patterns by providing the excitation beam irradiating the semiconductor layer in a pulsed manner with a maximum pulse length $t_{pump}$ of 50 μs.

In a second, analogous, embodiment, the invention provides a method for controlling THz radiation in a PPWG, comprising:

- providing a THz PPWG comprising parallel first and second electrically conducting layers and a semiconductor layer disposed between the first and second conducting layers, wherein one or more parts of one of the conducting layers is transparent to optical radiation;
- propagating THz radiation in the PPWG; and
- irradiating the semiconductor layer through the transparent conducting layer parts with an excitation beam of optical radiation in a pulsed manner with a maximum pulse length $t_{pump}$ of 50 μs to create a transient photo-induced pattern of charge carriers through the entire thickness of the semiconductor layer to control the THz radiation.

In the following, a number of preferred elements, features and implementations of the first and second embodiments are described, these are applicable to both the system and the method although being described in relation to only one of them.

The THz region of the electromagnetic spectrum is a frequency regime that separates the worlds of electronics (<100 GHz) and optics (>30 THz). THz radiation is essentially the high frequency part of the microwave band, and is for the purpose of the present specification defined as radiation in the range 0.1 THz-10 THz, relevant data for THz radiation is listed in Table 1 below.

TABLE 1

|  | Frequency | |
| --- | --- | --- |
|  | 0.1 THz | 10 THz |
| Position in EM spectrum | low frequency border of THz spectrum, towards the electronic regime (MW and RF) | high frequency border of THz spectrum, towards the optical regime (IR and visual) |
| Wavelength (free space) | 3 mm | 30 µm |
| Wavelength in Silicon (n ~3.4) | 890 µm | 8.9 µm |
| Pulse duration in commercial systems |  | 0.5 ps |

As a side note, there is no unambiguous naming of the different regions of the electromagnetic spectrum, and in some references, the low/high frequency parts of the region 0.1 THz-10 THz is also called the extremely high frequency (EHF) region and the far infra read (FIR) region.

Also for the purpose of the present specification, optical radiation is defined as infrared, visible or ultraviolet radiation having frequencies higher that 10 THz.

The THz radiation can be THz signals which are frequency-, phase- or amplitude-modulated to hold information or data to be transmitted in the PPWG. It is preferred that the propagating THz radiation is pulsed, such as consisting of short pulses, preferably having a pulse duration of less than 100 picosecond (ps=$10^{-12}$ s), such as less than 50 or 10 ps.

The generation of free charge carriers in the semiconductor layer causes a change (or modulation if generated by time-dependent field) of both the real and imaginary part of the refractive index as experiences by THz radiation propagating in the PPWG. The photo-induced pattern of charge carriers forms one or more conductivity regions corresponding to metallic regions in the semiconductor material.

In order to control the propagation of the THz radiation with these conductivity regions, it is important that they do not smear out and dissolve to become only poorly defined as seen by the THz radiation. Generally, carrier diffusion may be quantified by the carrier diffusion length, L, expressed as:

$$L=(D\tau)^{1/2},$$

Where the carrier lifetime (or recombination lifetime) τ is the average time it takes an excess minority carrier to recombine in the semiconductor material. D is the diffusion coefficient or diffusivity for the semiconductor material. Both depend on impurities or dopants in the semiconductor material and the temperature. As an example, pure silicon at room temperature has a carrier lifetime τ, on the order of τ ~100 µs and a diffusion coefficient D ~10 cm²/s, resulting in a carrier diffusion length L ~300 µm.

The transient nature of the photo-induced pattern according to the present invention allows timing of the THz light with the optical excitation, such that the THz pulse can interact with the conducting region before it has a chance to spatially diffuse. Thereby the invention provides the advantage of ensuring well defined conductivity regions which can be used for forming optical components such as components formed by photonic crystals. From this point of view, the invention thereby solves the problem of forming a spatially well-defined photo-induced pattern that does not smear out due to carrier diffusion.

The maximum excitation pulse length serves to ensure that the photo-induced pattern does not smear out or become poorly defined, as this will lead to losses or hinder the intended function to be performed by the pattern.

Provided the THz light interacts with the excited conducting region before carriers diffuse, the injected carriers can form useful optical components such as photonic crystals. The delay time, $t_D$, between injection of carriers and the interaction of the THz light with the conducting region must be shorter than the recombination time of carriers to ensure sufficient conductivity, and must also be short enough so that carriers have not diffused. Since the pump pulse length, $t_{pump}$, must be comparable and preferably shorter than $t_D$, this places a limitation on the maximum pulse width by which useful optical components can be defined in terms of the diffusion constant of the semiconductor material given by:

$$t_{pump} < L_{max}^2/D$$

where $L_{max}$ is the maximum length that a carrier distribution can diffuse and still remain useful as an optical component. This can be roughly approximated as the wavelength of the THz light in the semiconductor, such that for a 1 THz frequency, λ=89 µm and for a typical D of 10 cm²/s the corresponding excitation or pump pulse length of the optical excitation is $t_{pump}$=7.9 µs, and longer for larger wavelengths. As high repetition operation is desirable for commercial applications, the excitation pulse length is shorter than 50 µs.

For high repetition rates it is desirable to have even shorter excitation pulse lengths. On the other hand, the price for lasers often increase with shorter pulse lengths, so the excitation pulse length of choice needs to balance performance and price. In preferred embodiments, the excitation pulse length is shorter than 1 µs, such as shorter than 100 ns or 1 ns. In high repetition rate systems where even shorter pulse lengths are desired, the excitation pulse length is preferably shorter than 100 ps (ps=$10^{-12}$ s), such as shorter than 50 ps or 10 ps or even 1 ps. In systems applying very high repetition rates and ultrashort excitation pulses, the excitation pulse length is preferably shorter than 500 fs or 100 fs (fs=$10^{-15}$ s), such as shorter than 30 fs or even 10 fs.

The excitation pulse length is the pulse length of the pulse that irradiates the semiconductor, and need not be the pulse length of the optical (excitation) radiation source as this may be stretched or compressed on the path to the PPWG. In a preferred embodiment, however, the optical radiation source is a pulsed laser such as a laser providing short pulses, preferably pulses having a duration of equal to or less than the pulse lengths mentioned above.

In some embodiments, it desirable to impress different modulation on subsequent THz pulses, the pattern generated by the optical radiation in the PPWG for one THz pulse has preferably vanished when the subsequent THz pulse arrives. Therefore, it may be advantageous to have a short free carrier lifetime, τ, in the semiconductor material of the PPWG. Shorter free carrier lifetimes may typically be obtained by techniques such as doping, radiation-induced damage, incorporation of quantum dots or polycrystalline grains. Hence, it may be preferable to select or modify the semiconductor layer to have a free carrier lifetime, τ, shorter than 10 µs, such as shorter than 100 ns or 1 ns. In high repetition rate systems where even shorter free carrier lifetimes are desired, τ is preferably shorter than 100 ps, such as shorter than 10 ps or even shorter than 1 ps.

Similarly, in some embodiments, it desirable to reduce the free carrier diffusion length, $L_D$, in the semiconductor material of the PPWG in order to reduce the smearing out of the photo-induced patterns. Hence, it may be preferable to select or modify the semiconductor layer to have a diffusion length smaller than 250 µm, such as smaller than 200 µm, 100 µm, 50 µm or even smaller than 10 µm.

As mentioned, the transient nature of the photo-induced pattern presumes timing of the THz pulse with the optical excitation pulse, such that the THz pulse can interact with the conducting region before it has a chance to spatially diffuse and such that subsequent THz may potentially be modulated differently. For this reason, a preferred embodiment of the system comprises a synchronization unit for locking the repetition rate of the optical radiation source to a received clock signal indicative of the repetition rate of THz pulses and adjust a delay between excitation beam pulses with the THz pulses, to ensure the timing between the excitation pulses with the THz pulses.

To cause generation of free charge carriers, the radiation of the excitation beam pulses should have sufficient energy to excite charge carriers (electrons, holes) into the conduction band of the semiconductor material. This can be achieved by proper selection of a frequency (v) having an above bandgap energy ($v\hbar > E_g$, where $\hbar$ is Planck's constant and $E_g$ the bandgap energy of the semiconductor material), or by having an intensity sufficient for multi-photon excitation. In an alternative implementation, photoconducting polymer in the PPWG is excited, generating an exciton which then thermally dissociate into free carriers (electrons and holes) in the semiconductor.

The beam shaping elements may comprise components for controlling the physical shape of the excitation beam (e.g. mirrors, lenses, phase plates, spatial filters), and components for controlling the temporal shape of the excitation beam pulses (e.g. delay lines, transmission modulators). Thus, 'shaping' refers both the geometrical and temporal shape of the excitation beam. Also, the beam shaping element may be integrated in another structure, such as transparent parts or sections of one of the conduction layers forming a specifically shaped transmission window.

The beam shaping elements and the optical radiation source may be integrated or otherwise placed together, so that at least part of the shaping occurs directly at the source. As an example, temporal shaping or modulation to make the photo-induced patterns transient could be done my modulating the power to the optical radiation source, in which case one of the beam shaping elements comprises circuitry performing this modulation.

In a preferred embodiment, the beam shaping elements comprises means for temporarily modulating the excitation pulses (such as by selection of pulses) and thereby the photo-induced pattern. This may be applied to modulate the THz radiation, such as to encode information or data onto a THz signal by frequency-, phase-, or amplitude-modulation. Such temporal modulation may be selection or delay of pulses in the excitation beam by use of an optical transmission modulator (e.g. an interferometer). This is advantageous for forming transient photo-induced excitation patterns for which the generated photoconductivity regions does not diffuse before a THz pulse is transmitted. This is further advantageous for forming transient photo-induced excitation patterns which can be used to individually control or modulate THz pulses in the PPWG.

For this purpose, the system may preferably comprise a control circuit for controlling the beam shaping elements to modulate the THz radiation in response to a received electrical control signal or optical control signal. This is advantageous for obtaining a system configured to form a multitude of active components for controlling the THz radiation in the PPWG.

As mentioned, at least part of one of the conducting layers is transparent to optical radiation. The transparent part(s) may be region(s) forming a pattern being used to shape the excitation beam, or it may be a section making the conducting layer transparent in the region being irradiated by the excitation beam. In these embodiments, only parts (regions or a section) are transparent whereas the remaining parts may be nontransparent conducting layer. The transparent parts of the conducting layer typically have a lower conductivity and may therefore introduce higher losses than nontransparent parts. These embodiments where only selected regions or sections are transparent thereby provides the advantage of decreasing the overall losses of the PPWG.

It is preferred that the conducting layers, including the transparent parts have a thickness, $D_{TP}$, that prevents or significantly reduces coupling or leaking of THz radiation out of the waveguide. In other words, it is preferred that the conducting layers, including the transparent parts confines the THz radiation in the semiconductor layer. This may be provided by selecting the thickness $D_{TP}$ larger than the skin depth $\delta_{THz}$ of the THz radiation in the conducting layers. The skin depth is typically calculated as:

$$\delta_{THz} = \sqrt{\frac{2\rho}{\omega\mu_0}},$$

where $\rho$ is the resistivity and $\mu_0$ the magnetic permeability of the conducting layer, e.g. transparent parts of such, and $\omega$ is the angular frequency of the THz radiation in the PPWG. It is thus preferred that the photo-induced pattern, which are created under the transparent parts, does not lead to or result in coupling or leaking of THz radiation in/out of the PPWG.

At the same time as it confines THz radiation in the PPWG, the transparent conducting layer parts should provide a reasonable transparency for the excitation radiation. Thus, since the wavelength of the excitation radiation also has to be selected for excitation in the semiconductor layer, the overall design of the system includes a number of elements:

Confinement of THz radiation in semiconductor layer. Parameters affecting this comprises: material composition of the transparent parts; thickness of the transparent parts; wavelength of the THz radiation in the PPWG.

Transparency of transparent conducting layer parts. Parameters affecting this comprises: material composition of the transparent parts; thickness of the transparent parts; wavelength of the excitation radiation.

Excitation, by the excitation pulses, through the thickness of the semiconductor layer. Parameters affecting this comprises: material composition of the semiconductor layer; thickness of the semiconductor layer; wavelength of the excitation radiation; intensity of the excitation radiation (after passage through the transparent layer).

Procedures or recipes for proper selection, and possibly optimization, of these parameters to balance the confinement, transparency and excitation will be described in greater detail later. In a further aspect of the invention, a method is provided for designing a system according to the first aspect, comprising selecting the various parameters of the system according to such procedures or recipes.

In the following, third and fourth embodiments of the invention are described. Preferred elements, features and implementations described in relation to the first and second embodiments are applicable hereto as well, when appropriate.

In a third embodiment, the invention preferably provides a system for controlling THz radiation in a PPWG, comprising:
a THz PPWG comprising parallel first and second electrically conducting layer and a photorefractive dielectric (insulator, semiconductor, crystals) layer disposed between the first and second conducting layers, wherein one or more parts of one of the conducting layers is transparent to optical radiation;

an optical radiation source for generating an excitation beam for irradiating the dielectric layer through the transparent conducting layer parts to change the real part of the refractive index of the dielectric layer in the THz regime by the photorefractive effect through the entire thickness of the dielectric layer; and one or more beam shaping elements for controlling the excitation beam to create transient photo-induced pattern excitation in the dielectric layer for controlling THz radiation propagating in the PPWG.

Also, in a fourth embodiment, the invention preferably provides a method for controlling THz radiation in a PPWG, comprising:

providing a THz PPWG comprising parallel first and second electrically conducting layers and a photorefractive dielectric layer disposed between the first and second conducting layers, wherein one or more parts of one of the conducting layers is transparent to optical radiation;

propagating THz radiation in the PPWG; and irradiating the dielectric layer through the transparent conducting layer parts with an excitation beam of optical radiation to create a transient change in the real part of the refractive index of the dielectric layer in the THz regime by the photorefractive effect through the entire thickness of the dielectric layer to control the THz radiation.

Here, the dielectric may be a photorefractive material such as a non-linear crystal, and the changed electromagnetic properties of the dielectric in the THz regime are changes in the real part of the refractive index by the photorefractive effect.

Alternatively, the dielectric is a semiconductor material and the changed electromagnetic properties of the dielectric in the THz regime are generation of free charge carriers in the semiconductor material, similarly to the first and second embodiments of the invention.

The various embodiments of the invention are further advantageous in that the different parts may be integrated on a chip-scale active component, such as a micro chip or a substrate also holding the PPWG. Hence, one or more of the beam shaping elements, the optical radiation source and the control circuit are preferably integrated on the substrate also holding the PPWG.

The basic idea of the invention is to use optical radiation to modulate the EM properties of regions in a THz PPWG, which is then used to control the propagation of THz radiation in the PPWG.

This is advantageous since optical radiation, due to its shorter wavelength, is capable of selectively exciting regions which are small compared to the wavelength of the THz radiation to be modulated. A high spatial resolution of the photo-induced excitation pattern can thereby be achieved without the use of advanced optics or special methods.

This is further advantageous since the optical radiation generating the excitation pattern in the PPWG and the THz radiation to be guided in the PPWG interacts differently with the material due to their different frequencies; the dielectric being excited by the optical radiation whereas it is transparent to the THz radiation.

Such differentiation between the generating of a component and the being modulated by the component would not be possible if radiation of similar frequencies where applied for these purposes.

BRIEF DESCRIPTION OF THE FIGURES

The present invention will now be explained, by way of example only, with reference to the accompanying Figures, where

FIG. 5 is a schematic illustration of a system according to an embodiment of the invention.

FIGS. 6A and B are graphs presenting results from an implementation of the embodiment of FIG. 5.

DETAILED DESCRIPTION OF THE INVENTION

The embodiments of the invention provide systems and methods for controlling THz radiation in a PPWG. These can be used to form a broad variety of passive and active components for controlling THz radiation in various applications. It is thereby to be understood that the THz radiation can be THz signals which are frequency-, phase- or amplitude-modulated to hold information or data to be transmitted in the PPWG. Also, the active component can be used to frequency-, phase- or amplitude-modulate information or data onto a THz signal.

Such THz signals may be applicable in THz communication, digital computing or sensor application such as in lab-on-a-chip application, and these are also preferred applications of the embodiments of the methods and systems according to the invention.

Figure 1:
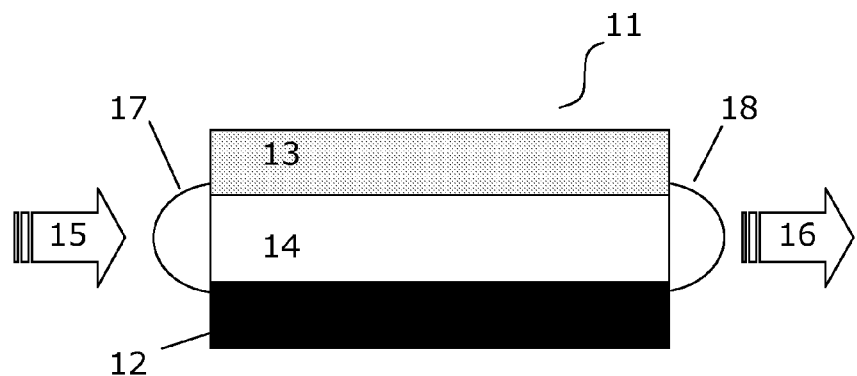
FIG. 1 is a schematic illustration of a PPWG as used in various embodiments of the invention.

FIG. 1 shows a THz PPWG structure 11 as used in embodiments of the present invention. Here, a dielectric slab 14 is sandwiched between two electrically conducting plane layers 12 and 13 of which at least one, here layer 13, is transparent to optical radiation or have parts or sections which are transparent to optical radiation. Layers 12 and 13 are preferably parallel.

To enable coupling of THz radiation to/from the PPWG, the structure can be supplied with plano-cylindrical lenses 17 and 18. The coupling cab be quasi-optic coupling of freely propagating THz radiation or be direct coupling from another waveguide structure. In the latter case, other means for coupling can be applied.

The planar conducting layers 12 and 13 serves to ensure a single TEM-mode propagation of the THz radiation in the PPWG. The thickness and material of layers 12 and 13 can be chosen to be good conductors as this minimises losses in the PPWG. Metal plates or layers of e.g. copper, aluminum, gold, silver (non-exhaustive list) can be used. For the transparent or partly transparent conducting layer 13, however, the thickness and material selection is a tradeoff between good electrical conduction properties and transparency for the frequency of the excitation beam. Therefore, in some embodiments, the conductivity of layer 13 is optimised by only making the necessary regions transparent to optical radiation, e.g. regions irradiated by the excitation beam, such as immediately under the beam shaping elements. Alternatively, transparent parts of layer 13 is patterned so as to form a shadow mask, thereby incorporating at least one beam shaping element in the conducting layer 13. The transparent parts of conducting can be a film of transparent conducting oxide (TCO) such as fluorinated indium oxide, indium tin oxide (non-exhaustive list). TCOs have the advantage of being transparent for optical radiation and conductors for THz radiation. For some applications, it can also be of interest to have the conductive layer 12 transparent in order to monitor the excitation beam that pass through the PPWG Dielectric layer 14 determines the group velocity of the TEM mode and serves as a medium for the photo-induced pattern according to the invention.

In a preferred embodiment where the photo-induced pattern is a produced by charge carrier excitation, the dielectric layer 14 is at least partly formed by semiconductor material such as Silicon, gallium arsenide, germanium (non-exhaustive list). In some implementations, the photo-induced pattern of excited charge carriers can be modulated in time, and a short free carrier lifetime, $\tau_L$, may be therefore be advantageous. Silicon typically have $\tau_L$ of the order of 10 μs, and shorter $\tau_L$ may be obtained by doping, radiation-induced damage, incorporation of quantum dots or polycrystalline grains. In some implantations, it is advantageous for the semiconductor to have a high charge carrier mobility to achieve maximum change in conductivity for a given optical excitation. Thus materials that have a combined short free carrier lifetime and a high carrier mobility are preferred.

In another embodiment the photo-induced pattern is a produced by charge carrier excitation, the dielectric layer 14 is at least partly formed by materials displaying non-linear behaviour in the optical regime, typically non-linear crystals such as strontium barium nobiate (SBN:75).

Other layers or gaps between layers 12, 14, and 13 is possible and may be used to enhance the generation of photo-induced patterns or reduce losses.

In general, the loss of the PPWB is determined by the conductivity in the conducting layers 12 and 13, and becomes greater with increasing frequency of the THz radiation because of the high frequency roll off of the conductivity in the conducting layers. How much loss is acceptable generally depends on the required length of the structure 11. Losses in a PPWG used in an embodiment of the invention will be treated in detail later.

The thickness of the waveguide (the spacing between conducting layers 12 and 13) is selected to be approximately half the wavelength of light in the dielectric layer 14. With a refractive index of ~3.4 in Silicon, this gives a minimum spacing of ~5 μm for radiation with a frequency of 10 THz and a minimum spacing of ~450 μm for radiation with a frequency of 0.1 THz. In principle, the spacing between conducting layers 12 and 13 can be larger, but it is preferred not to excite lossy and dispersive higher order modes.

There is a low frequency cutoff for a PPWG, given by fc=mc/2dn where f is the frequency, m is an integer that labels the mode, c is the speed of light, d is the dielectric thickness and n is the index of refraction of the dielectric. In quasi-optic coupling, you are exciting with a symmetric field at the entrance of the plates and therefore exciting the anti-symmetric first mode (TM1) does not present a great risk. The coupling into the TM2 mode is weaker, but can occur if the plate separation or the frequency is large enough. As an example, a 50 μm thick Si slab has a TM2 cut-off of 1.76 THz, so any frequencies significantly higher than this can couple into TM2. The above can thereby be used as a guideline for determining a maximum thickness of the dielectric slab in the PPWG.

As the radiation is often broadband pulses, the thickness is typically just roughly tuned to the applied radiation. However, it is preferred that the spacing between conducting layers 12 and 13 is at least $15/n_D$ μm, where $n_D$ is the refractive index of the dielectric layer 14, such as at least 3 μm, 5 μm or at least 10 μm. Also, the spacing between conducting layers 12 and 13 is preferably less than $1500/n_D$ μm, such as less than 500 μm, 300 μm or less than 100 μm.

Fabrication of PPWG structures according to the above requirements are within the expertise of persons skilled in semiconductor processing.

FIGS. 2, 6, 10 and 11 illustrate various embodiments of a system for controlling THz radiation in a PPWG according to the invention. In there embodiments, the system (20, 50, 100, 110) comprises a PPWG 11 with conducting layer 12, transparent or partly transparent conducting layer 13 and dielectric layer 14, preferably based on semiconductor material.

The optical radiation source 27 can be a pulsed laser or a laser array, the applicable laser types depend on the application and include vertical-cavity surface-emitting lasers (VCSELs), vertical-external cavity surface-emitting lasers (VECSELs), diode lasers, ultrashort pulsed lasers, fiber lasers (non-exhaustive list). The generated excitation beam (preferably in the form of a pulse train) 28 (not visible on FIG. 10) irradiates the PPWG through beam shaping elements 29, 32 or 41. After the beam shaping element, the excitation beam irradiates the dielectric layer 14 through the transparent conducting layer 13. The beam shaping element controls the excitation beam and creates a photo-induced pattern in the dielectric layer 14 layer.

The excitation beam 28 preferably has normal incidence on the transparent conducting layer 13 in relation to the direction of propagation for THz radiation in the PPWG, also after passing through the beam shaping element. The excitation beam 28 can consist of several beams and the system can include guiding media for the guiding the excitation beam 28 to/from the beam shaping element.

The optical radiation source is chosen to be capable of generating a photo-induced excitation pattern in the dielectric. The pattern consists of regions wherein the excitation beam, as patterned by the beam shaping element, has changed the electromagnetic properties of the dielectric in the THz regime. The selected characteristics of the optical radiation source, e.g. frequency, pulse duration, power, therefore depends on the dielectric material and on the physical excitation relied upon.

Figure 2A:
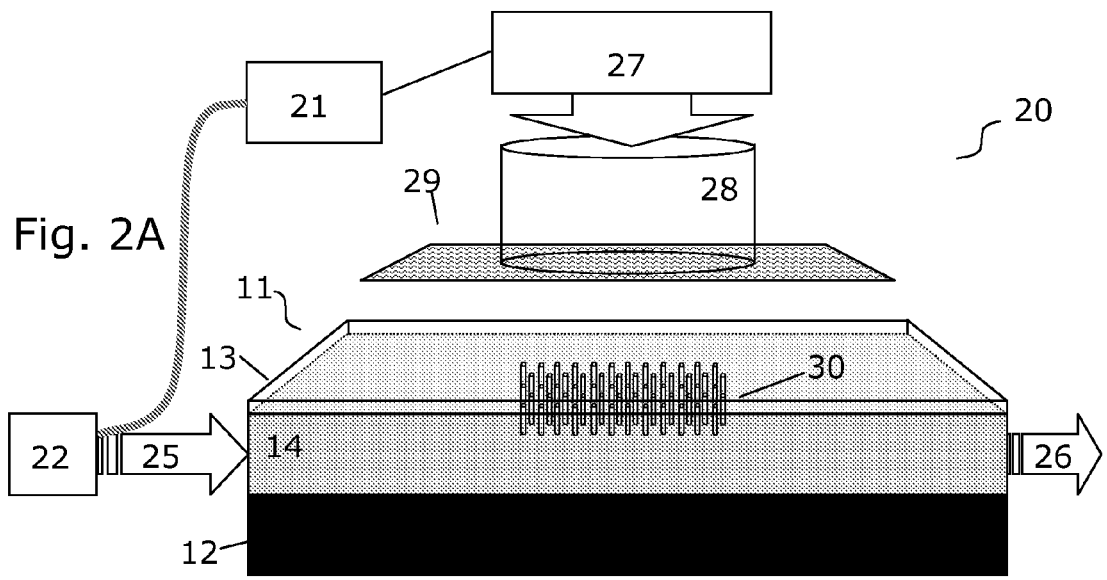
FIGS. 2A and B are schematic illustrations of a system according to an embodiment of the invention.
Figure 2B:
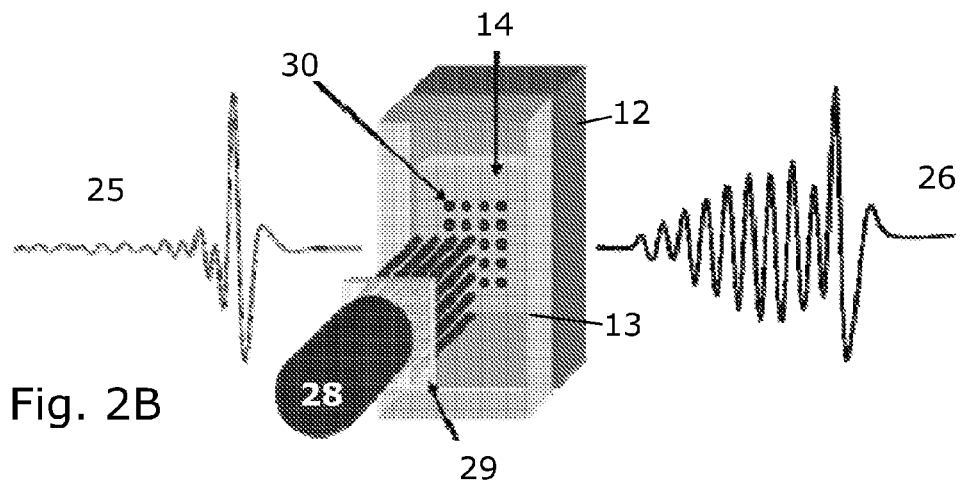

In one embodiment, here exemplified in FIG. 2A, the system comprises a synchronization unit 21 that ensures the timing between excitation pulses and THz pulses. The synchronization unit 21 receives a clock signal indicative of the repetition rate of THz pulses to be controlled. Such clock signal may be an optical or a THz signal split of from the THz source 22 or be part of a received THz signal (in some modulation schemes). The synchronization unit locks the repetition rate of the optical radiation source to the clock signal. An example of this synchronization relies on a phase locked control loop that adjusts a piezo element controlling the cavity length of a laser, synchronizing the laser repetition rate to the clock. Such systems are currently commercially available and are used to synchronize two different color lasers. The synchronization unit also adjusts the temporal overlap of the excitation pulses with the THz pulses. This can be done by a controllable delay line which may be electrical (for longer pulse lengths/lower repetition rates) or optical in the form of an optical translation stage allowing control on the scale of a few fs.

In a preferred class of embodiments, the dielectric is a semiconductor. Above-bandgap photo excitation within the semiconductor layer 14 introduces free charge carriers that can then modulate the transmission properties of the THz radiation in the PPWG. In this case, the frequency of the laser is tuned to above the optical band edge of the semiconductor material, e.g. wavelengths less than 1100 nm for Silicon. In alternative implementations, an excitation beam with lower frequency can be applied, having sufficient power to induce multi-photon excitation in the used semiconductor material. This can have the advantage of providing a more uniform excitation profile through the thickness of the semiconductor layer 14.

To achieve close to uniform excitation through the dielectric layer 14, the penetration depth of the excitation beam is preferably greater than the thickness of the layer. For Silicon and pumping at 1 um, the penetration depth is ~100 µm. This can be increased by increasing the wavelength so that it is closer to the band edge of the semiconductor (but still above $E_g$).

The beam shaping elements depend on the specific application, i.e. on which pattern the intended to be induced and if it is going to be modulated, hence, 'shaping' is also refers to shaping in time. The beam shaping elements can include lenses, phase plates, spatial filters, shadow masks, optical fibers, waveguides, microlens arrays, mirrors, beam splitters, holograms, LCDs, optical delay lines, as well as active optical components such as switches, interferometers, modulators, filters, beam steering, and resonators.

The beam shaping elements can be configured to temporally modulate the photo-induced pattern. The THz can be pulsed, such as ultra short pulses with picosecond duration or shorter, but with a repetition rate allowing to a modulating beam shaping elements to change the photo-excited pattern between THz pulses. For such applications, the optical radiation source is preferably also pulsed, with similar pulse duration and repetition rate, and the temporary photo-induced pattern and THz pulse can overlap in time. This allows tailoring of the photo-induced pattern to each individual THz pulse.

Figure 10:
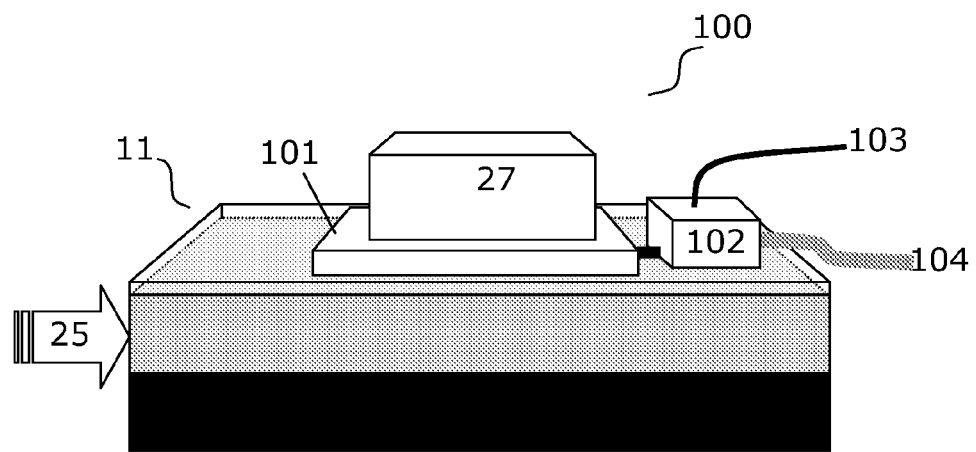
FIG. 10 is a schematic illustration of a system according to an embodiment of the invention.

The system can therefore further comprise a control circuit 101 for controlling the beam shaping elements to temporally modulate the photo-induced pattern to control the THz radiation, see FIG. 10. In one embodiment, the control circuit can control the beam shaping elements to modulate the excitation beam in response to a received electric modulation signal so that some THz pulses in the PPWG is dumped whereas others are transmitted undisturbed.

The control circuit 101 can e.g. control the beam shaping elements in response to a received electrical control signal 103 or optical control signal 104, and can be integrated on the substrate holding the PPWG.

Now, turning to the embodiment of FIGS. 2A and B, illustrating different views of the same system, the beam shaping element 29 here forms a photo-induced excitation pattern that produces a light-induced photonic crystal (PC) in the semiconductor layer. PCs are formed by modulating the index of refraction of a material periodically on a length scale comparable to the wavelength of light. Two dimensional structures are highly interesting from the device perspective as they can be created in-line with existing planar circuits and are much easier to fabricate than their 3-D counterparts.

One of the major advantages of THz photonics is the relatively long wavelength (1 THz=300 um), and so photonic crystal structures are defined on the micron scale, not the nanometer scale as they are for visible light. Therefore, in the present case of THz PPWG's, a 2-D photonic crystal structure for radiation 25 in the THz regime can be formed in the layer 14 by photo-induced excitation using the excitation beam 27 in a pattern determined by the beam shaping element 29, leading to columns 30 of photo excitation. In case of semiconductor layer, photoconductivity induced in columns 30 would form a periodic lattice of metallic regions inside the PPWG. Since the photonic crystal structure is defined on the micron scale, the dimensions of the structures are considerably above the diffraction limit for the optical radiation. This reduces the requirements to the applied optics and simplifies the setup.

The beam shaping element 29 used to form the PC lattice pattern can e.g. be a phase plate, a microlens array, a hologram, a shadow mask, programmable spatial light modulator using phase or amplitude modulation. In another implementation, the beam shaping elements could be a fiber bundle where each fiber in the bundle would map into one lattice point in the PC lattice. In such case, the beam shaping elements can be e.g. individual lenses for each fiber or a microlens array.

Since the photonic crystal is generated by photo excitation from the excitation beam 27, the lattice constant and radius of excitation can be changed instantly by changing the beam shaping element 29, and defects can be introduced into the crystal simply by selectively blocking for certain columns in the lattice. This latter point is advantageous as defects are responsible for guiding of light and creation of resonating structures that can be used for device applications.

Figure 3A:
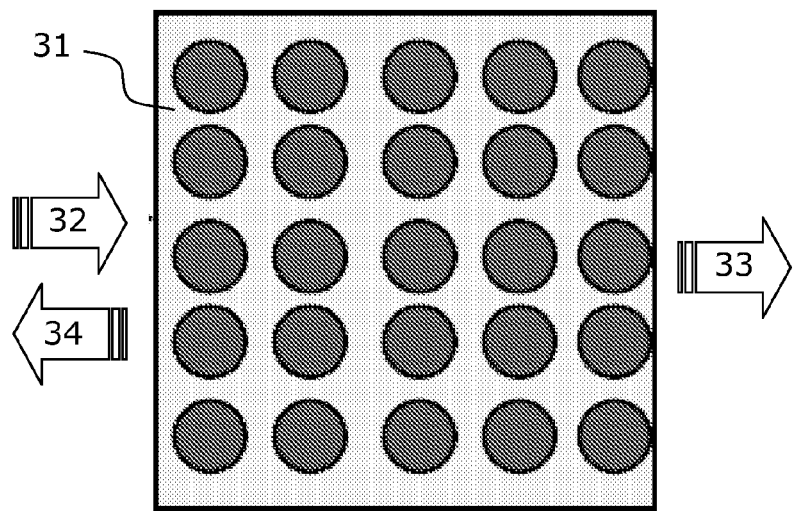
FIGS. 3A-C illustrate different components generated by photo-induced patterns according to the embodiment of FIG. 2.
Figure 3B:
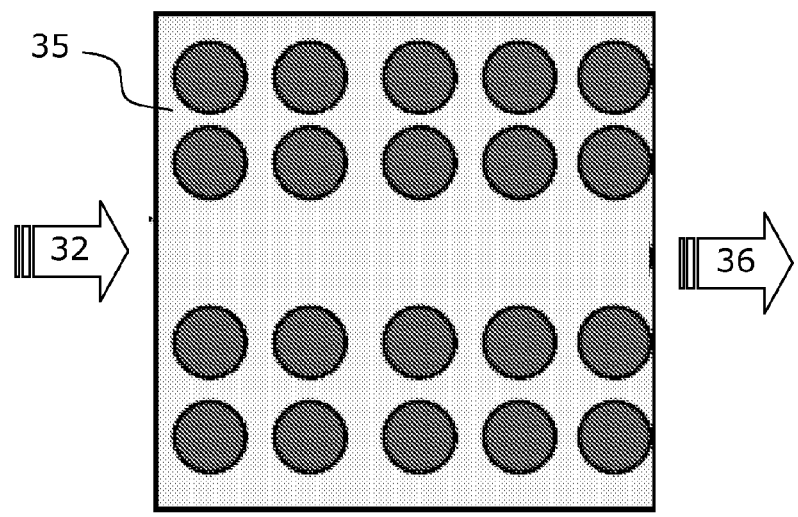
Figure 3C:
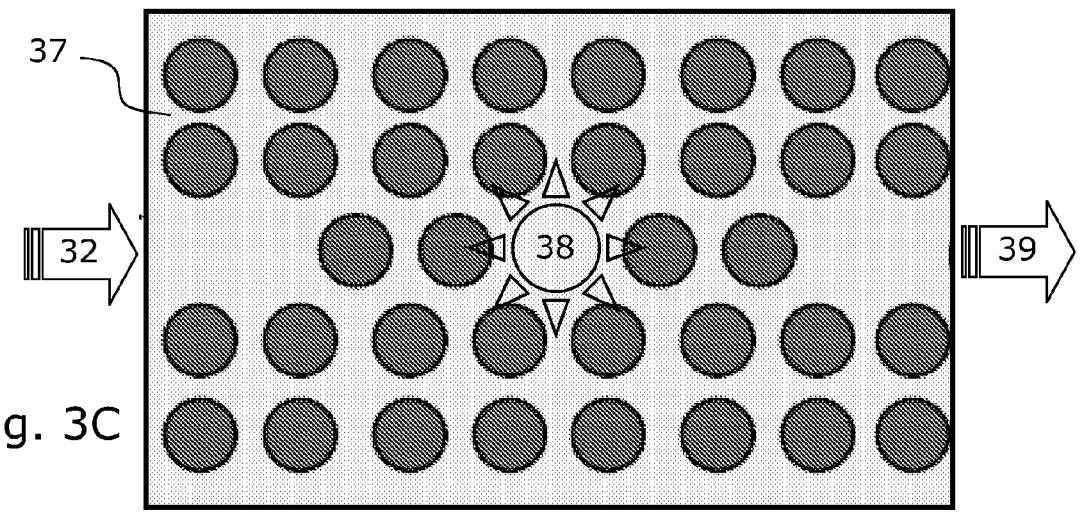

FIGS. 3A-C show layouts 31, 35 and 37 of the photo-induced excitation pattern that provides PC lattices forming components for controlling THz radiation in PPWGs. These PC structures can be produced using the system described in relation to FIG. 2. FIG. 3A shows a layout 31 forming a frequency filter for THz radiation 32 propagating in the PPWG. The periodic metallic regions create a frequency-selective surface, where only certain frequencies 33 can propagate through the crystal and others 34 are reflected. FIG. 3B shows a layout 35 forming a waveguide for THz radiation 32 propagating in the PPWG. The waveguide is formed by a line defect in the lattice, and guided radiation 36 may e.g. be lead around bends. FIG. 3C shows a layout 37 forming a resonator 38 for THz radiation 32 propagating in the PPWG.

The resonator 38 is formed by point defects, and trapped radiation may be e.g. be used for sensor applications by monitoring of outgoing radiation 39.

Design Parameters

As mentioned previously, the system need to be designed to balance THz confinement in the PPWG, the transparency of the conducting layer to the excitation radiation and the excitation in the semiconductor layer by the excitation radiation. The design parameters of the system includes at least:

- thickness of the semiconductor layer $D_{SL}$;
- material composition of the transparent parts;
- thickness of the transparent parts, $D_{TP}$;
- wavelength of the THz radiation in the PPWG, $\lambda_{THz}$;
- wavelength of the excitation radiation, $\lambda_{EB}$;
- material composition of the semiconductor layer;
- intensity of the excitation radiation, $I_{EB}$.

The following section outlines design parameters and details of material properties important to the operation of the invention.

Waveguide modes: Radiation propagating in the PPWG in the TM configuration (electric field polarized perpendicular to the plates), propagate in modes defined by their lower cutoff frequency, $f_{c,m}$, below which no light can propagate. The modes are indexed by their mode number, m=0, 1, 2, ... such that the corresponding cutoff frequencies are given as:

$$f_{c,m} = \frac{mc}{2n_S D_{SL}},$$

where c is the speed of light and $n_S$ is the refractive index in the semiconductor material. It is only in the lowest order m=0 that propagates in the low loss and low dispersion TEM mode, where the field has no spatial dependence perpendicular to the plates. If the thickness of the semiconductor layer $D_{SL}$ becomes too large, the $TM_2$ mode is able to be excited which leads to dispersion and loss of the transmitted THz light. Odd order modes are spatially anti-symmetric and cannot be excited by a symmetric Gaussian beam. In practice, the TEM mode dominates over the $TM_2$ mode because of the better overlap with the exciting Gaussian beam so that $D_{SL}$ ~100 µm is suitable. In preferred embodiments, the thickness of the semiconductor layer $D_{SL}$ in the PPWB is equal to or less than 150 µm, such as equal to or less than 100 µm or 50 µm. In further embodiments, $D_{SL}$ is equal to or less than 25 µm or preferably 10 µm.

Transparent conducting layer: The transparent conducting layer in the PPWG serves two purposes: 1) defining the opposite plate of the PPWG with its electrically conductive properties and 2) serving as an optical port via its transmissive properties for optical excitation of the embedded semiconductor within the PPWG. This combination of properties is preferably provided by a transparent conductive oxide (TCO). The important parameters to balance are the sheet resistance of the film, $R_S$, and the transmission coefficient at optical wavelengths, T. The THz power loss coefficient, $\alpha_{THz}$, which defines the power loss of the transmitted THz light through the PPWG per unit length, is related to the sheet resistance by:

$$\alpha_{THz} = CR_S n_S/Z_0 D_{SL}$$

where C is the number of TCO layers (either 1 for an asymmetric waveguide or 2 for a symmetric), $n_S$ is the index of refraction of the semiconductor, $Z_0$ is the impedance of free space (377Ω) and $D_{SL}$ is the thickness of the semiconductor which also serves as a spacer between the conductive plates. We note that an asymmetric waveguide is preferred, taking advantage of the high conductivity of the other metal plate to reduce the loss. If the thickness of the TCO coating, $D_{TP}$, is thicker than the skin depth, $\delta_{THz}$, of the THz light into the TCO, $R_S = 1/\sigma_1 \delta_{THz}$ where $\sigma_1$ is the real conductivity of the film at the THz radiation frequency. Since $$\delta_{THz} = \sqrt{\frac{2}{\omega \mu_0 \sigma_1}}$$

we have the equation:

$$\alpha = \frac{Cn_D}{Z_0 D_{SL}} \sqrt{\frac{\omega \mu_0}{2\sigma_1}}$$

It is advantageous to have as high a $\sigma_1$ as possible to reduce losses. Typical TCO $\sigma_1$ are on the order of 2000 (Ωcm)$^{-1}$. While the loss can also be reduced by increasing $D_{SL}$, this introduces the possibility of coupling into higher order lossy modes other than the TEM mode, as well as complicates the requirement for uniform illumination through the semiconductor slab by the optical pump beam.

In general, the optical absorption in the transparent layer is sufficient that the transmission is a nearly monotonically decreasing function of thickness, such that the optimized film thickness is close to the skin depth of the THz radiation. This allows low loss guiding and typically >20% transmission. The optical transmission of the transparent layer can however be optimized by adjusting its thickness, $D_{TP}$, so that it forms an anti-reflection coating for the optical pump beam. This requires detailed knowledge of the dielectric properties of the film and accurate thickness control.

The wavelength of the excitation radiation, $\lambda_{EB}$, is chosen such that it is sufficiently energetic to excite charge carriers in the semiconductor layer, and in the transmission window of the transparent layer. Furthermore, the optical penetration depth of the excitation radiation must be comparable to the thickness of the semiconductor layer, $D_{SL}$, to ensure uniform excitation of carriers through the thickness of the layer so that there is no or little spatial variation of carrier concentration perpendicular to the plates. This is required for the induced optical elements to be two dimensional.

The composition of the semiconductor layer can be chosen such that it has a bandgap energy within the transmission window of the transparent conducting layer. A material with a poor optical absorption at the pump wavelength, such as an indirect bandgap semiconductor, ensures the pump penetration depth is on the order of 10-100 µm and comparable to $D_{SL}$, required to support TEM mode propagation in the PPWG. For high speed applications where fast switching rates are desirable, it is advantageous to have a short carrier recombination time or trapping time, such that carriers are either not present or no longer mobile and capable of absorbing or reflecting the THz field after a short time. This can be accomplished by doping a semiconductor material with charge carrier trap centres, such as quantum dots, or by using inhomogeneous semiconductors such as micro or nanocrystalline Si where traps exist at grain boundaries. This also limits the diffusion of carriers as they immobilize or recombine on time scales shorter than those required to diffuse and smear out the patterned excitation.

The energy per pulse of the excitation radiation must be capable of exciting a sufficient population of carriers in the material to induce a conductivity profile that can serve as a reflecting and/or absorbing medium to the THz pulse propagating in the PPWG. Calculation of the interaction of the THz pulse with the optical excitation requires transmission function or finite element calculations which divide the space into portions of near constant conductivity. A rough guideline, however, is that the peak induced conductivity of the excitation must correspond to a THz skin depth which is comparable to the characteristic length scale of the excitation profile. The required optical energy per pulse is related to the pump absorption, $\alpha_p$, quantum efficiency of created charge carriers and the mobility of carriers, $\mu$, in the semiconductor slab, which determines the overall induced conductivity. The carrier density is related to the optical pulse energy, E, by $$N = \eta \frac{E\lambda_{EB}T}{hcV}(1 - \exp(-\alpha_p D_{SL}))$$

where $\eta$ is the photon to mobile carrier quantum efficiency, T is the transparent layer transmission coefficient, h is Planck's constant, c is the speed of light and V is the excitation volume. The subsequent induced conductivity is given by $$\sigma_1 = \frac{Ne\mu}{1 + (\omega\tau)^2}$$

where the Drude form of the ac conductivity and $\tau$ is the carrier scattering time. The corresponding skin depth is then given by $$\delta_{THz} = \sqrt{\frac{2}{\omega\mu_0\sigma_1}}$$

So provided the excitation is sufficient to make $\delta_{THz}$ comparable to or smaller than the characteristic length scale of the excitation (full width at half maximum for example), then there can be an absorption or reflection event.

Example 1

Figure 4:
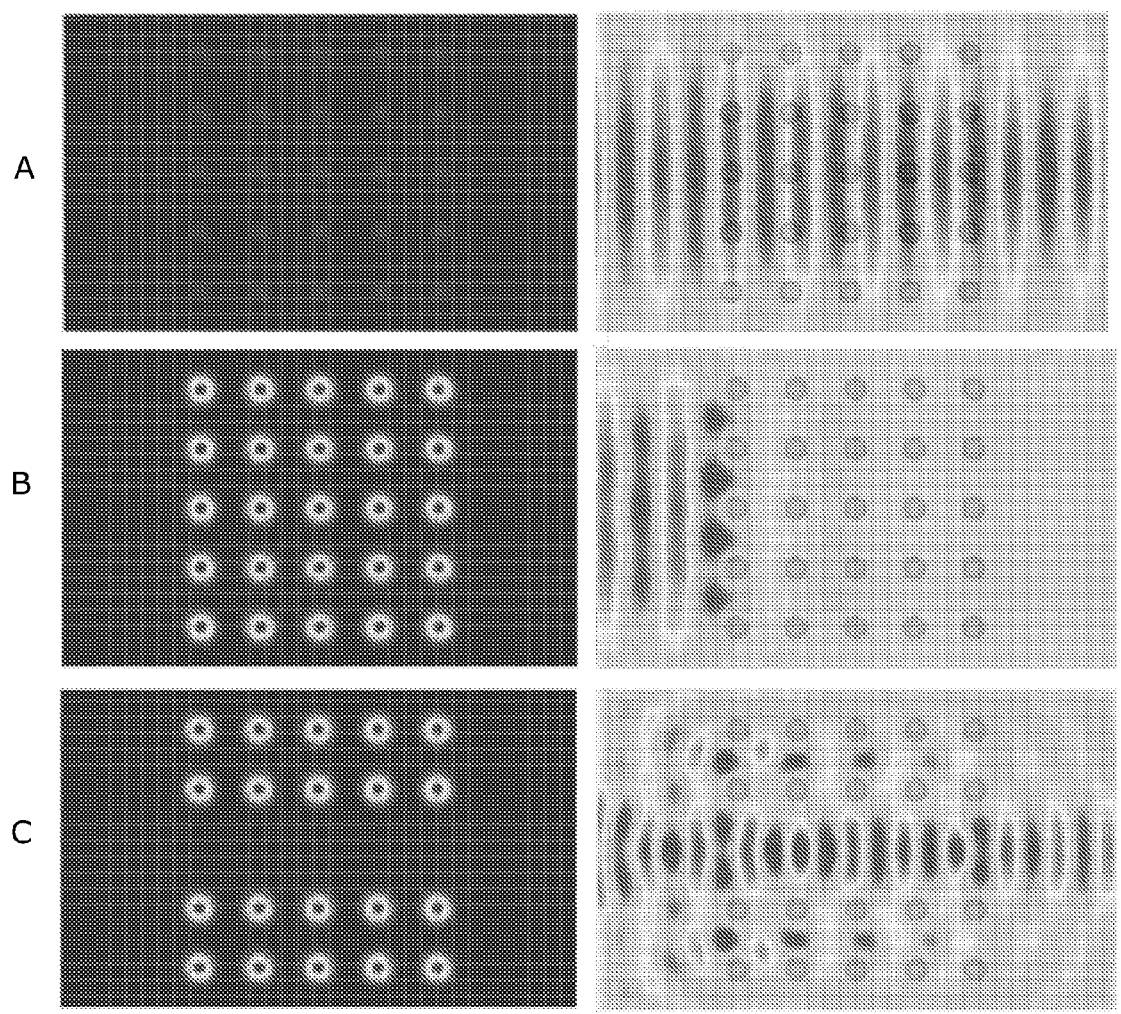
FIGS. 4A-C shows different simulation scenarios for components generated according to the embodiment of FIG. 2.

2-D finite element simulations of a square lattice of Gaussian conductivity embedded in a silicon slab has been performed and is described in the following with reference to FIG. 4. FIG. 4 shows three simulation scenarios of THz propagation (the electric field z-component, right images) through a DOT-PC formed by patterned photo excitation of silicon, and corresponding conductivity profiles (left images).

All three scenarios show harmonic simulations at a single frequency $\omega$=0.6 THz. The THz electric field is polarized parallel to the conducting columns, configured for single mode TEM propagation in the PPWG. The elements of the lattice are Gaussian conductivity profiles, reflecting the excitation with Gaussian laser spots with a width of 50 μm, easily achievable with standard optics. The pitch of the lattice is 150 μm, equal to the pitch of commercially available microlens arrays. A measure of the level of excitation is the plasma frequency, $\omega_p$, which is related to the carrier density, n, by the relation $\omega_p^2 = ne^2/\epsilon_0 m^*$ where e is the electron charge, $\epsilon_0$ is the permittivity of free space and $m^*$ is the effective mass of charge carriers in the silicon.

The three scenarios are A) $\omega_p$ is less than the probing frequency $\omega$; B) $\omega_p$ is greater than $\omega$; and C) $\omega_p$ is greater than $\omega$ and the lattice has a line defect. Scenario A has a low conductivity profile and is in the transparent regime for the radiation. This is what is achievable with low power femtosecond laser oscillators or CW excitation. In scenario B, the conductivity profile is high and the Gaussian spots act as pillars of metal and so has a low frequency cutoff below which light cannot propagate. It is in this regime that guiding of light is possible and we aim to achieve these levels of excitation. Scenario C shows an example of a waveguide formed by a simple line defect in the square lattice and verifies that such an optically induced lattice can form a photonic crystal waveguide.

The optical power of the excitation beam needed to observe this new form of dynamic photonic crystal is dictated by the carrier density and requires some consideration. The silicon slab thickness is on the order of 100 μm, and so for uniform illumination the optical penetration depth, $\delta$, of the excitation beam should be comparable. This limits our excitation beam wavelength, $\lambda$, to 1 μm where the penetration depth is ~100 μm in Si. Also, with the criterion that $\omega_p > \omega$, we have that E>20 nJ/pulse which is easily accomplished with a 1 kHz, 3.5 mJ/pulse high power femtosecond laser amplifier system plus an optical parametric amplifier, providing up to 10 μJ, fs laser pulses at 1 μm. Another consideration is the lateral diffusion of carriers. As previously mentioned, silicon has a relatively long carrier lifetime $\tau$, on the order of $\tau$ ~100 μs and so the initially well defined conductivity profile can possibly diffuse up to lengths of L ~300 μm for room temperatures, or double the lattice spacing and so the features may be washed out. Here, fs pulse excitation beam also provides a solution, as the THz pulse can traverse the photonic crystal immediately after photoexcitation, before carriers have a chance to significantly diffuse. Other solutions can be to dope Silicon or chose other semiconductor materials to obtain shorter carrier lifetimes or smaller diffusion coefficients.

FIG. 5 illustrates another embodiment of a system 50 for controlling THz radiation in a PPWG according to the invention. Here, the beam shaping element is a cylindrical lens 52 and the dielectric layer 14 comprises semiconductor material. The photo-induced excitation pattern produces a line 33 of photoconductivity that is seen as a mirror for THz radiation 25 propagating in the PPWG.

Example 2

We here give a brief review of an experiment showing optical modulation of THz radiation propagated in a transparent PPWG. The experiment applies a setup similar to that of FIG. 5, where a 125 μm thick Si slab was coated on both sides with fluorine indium oxide, a transparent conducting oxide, forming the PPWG. THz pulses were coupled into the waveguide, and the slab was then illuminated with CW output of 980 nm in a 50 μm wide line focus at 450 mW through the FTO coating. Photoexcited charge carriers in the Si then modulated the THz transmission through the slab, and by analysis of this modulation, the complex dielectric function $\epsilon(\omega) = \epsilon_1(\omega) + i\epsilon_2(\omega)$, was extracted. FIG. 6A shows time traces of THz pulse transmission through the PPWG with (61) and without (62) line excitation with the 980 μm CW laser—a clear modulation of the transmitted THz radiation is seen. FIG. 6B shows extracted complex dielectric function of induced free carrier modulation. The results were fitted and well described by a Drude model with a plasma frequency of 0.33 THz and a scattering time of 190 fs. This demonstrates it is possible to optically modulate the transmission of THz pulses in the slab—a more detailed account of this experiment will be given later in Example 3.

Figure 7:
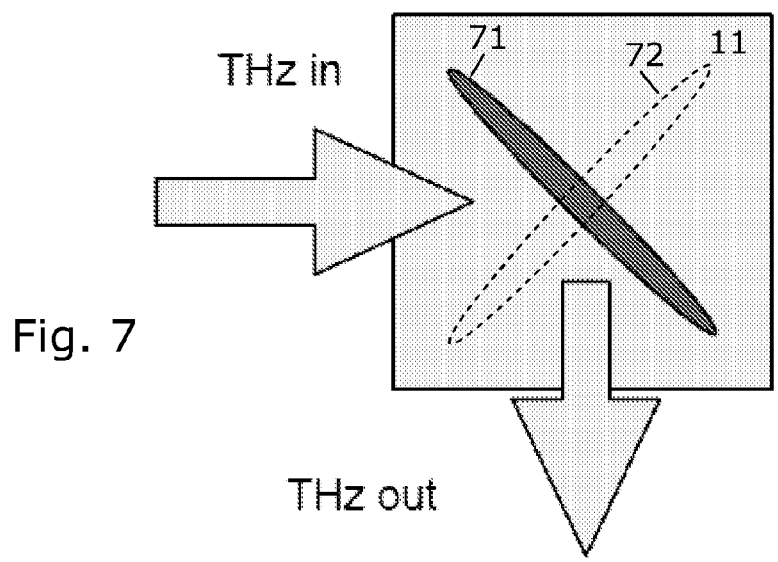
FIGS. 7-9 illustrate different components generated by photo-induced patterns according to the embodiment of FIG. 5.
Figure 8:
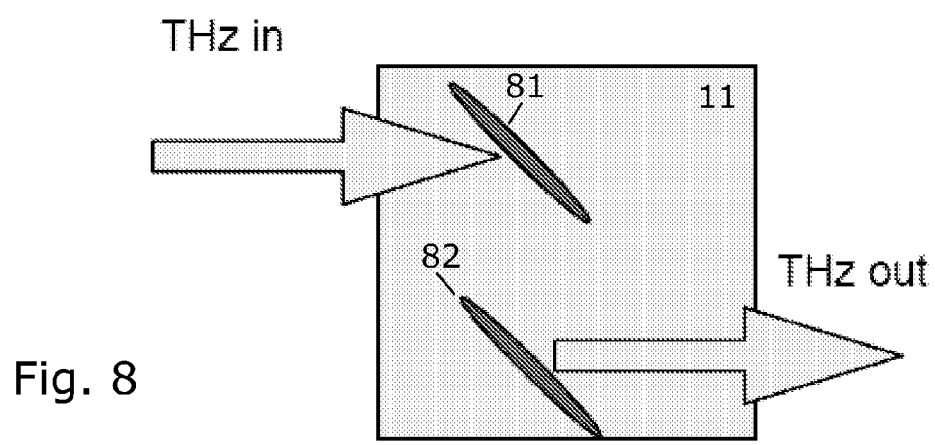
Figure 9:
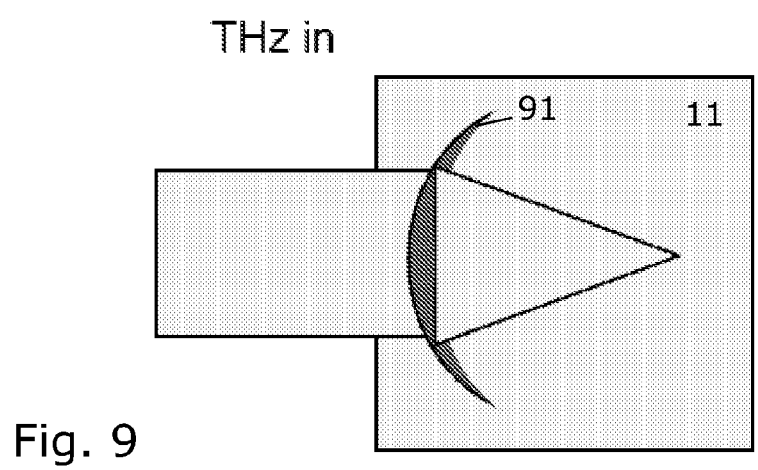

FIGS. 7 through 9 show different layouts of the photo-induced excitation pattern formed using the systems described in relation to FIG. 5, which provides different components.

FIG. 8 shows a layout of the photo-induced excitation pattern 71 that provides an angled mirror for deflecting the propagating THz radiation. This component can be used for beam steering. By making the system active, it is possible to switch between patterns 71 and 72, thereby providing a switch.

FIG. 9 shows a layout of the curved photo-induced excitation pattern 91 that provides a lens producing a focusing of the propagating THz radiation. By making the system active, it is possible to adjust the curvature and thickness of lens 91, thereby providing an adjustable focal length.

FIG. 10 illustrates another embodiment of a system 100 for controlling THz radiation in a PPWG according to the invention. Here, the beam shaping element 101 and the laser 27 are stacked and integrated on the substrate also holding the PPWG 11. The control circuit 102 can also be integrated as shown.

In an example of a integrated system, the laser, 27, can be for example a pulsed amplified fibre laser emitting in the window of 1030-1060 nm, which is sufficient to excite charge carriers in silicon and has a long enough optical penetration depth to ensure uniform excitation. A standard fibre collimater ensures a collimated beam is incident on the planar structure. A translucent electrically programmable spatial light modulator (EPSLM), 101, modulates the amplitude of the excitation beam through a control circuit, 102, equivalent to a standard computer VGA graphics chip, in response to a received electrical control signal 103. The spatial modulation defines a patterned excitation, creating the desired planar structure within a FTO-coated silicon slab with metallic back-coating. The EPSLM can be configured either through human interface via computer VGA board or through programmed patterns stored on an integrated memory element with the VGA chip and triggered by an internal clock on the board or by an external signal.

Figure 11:
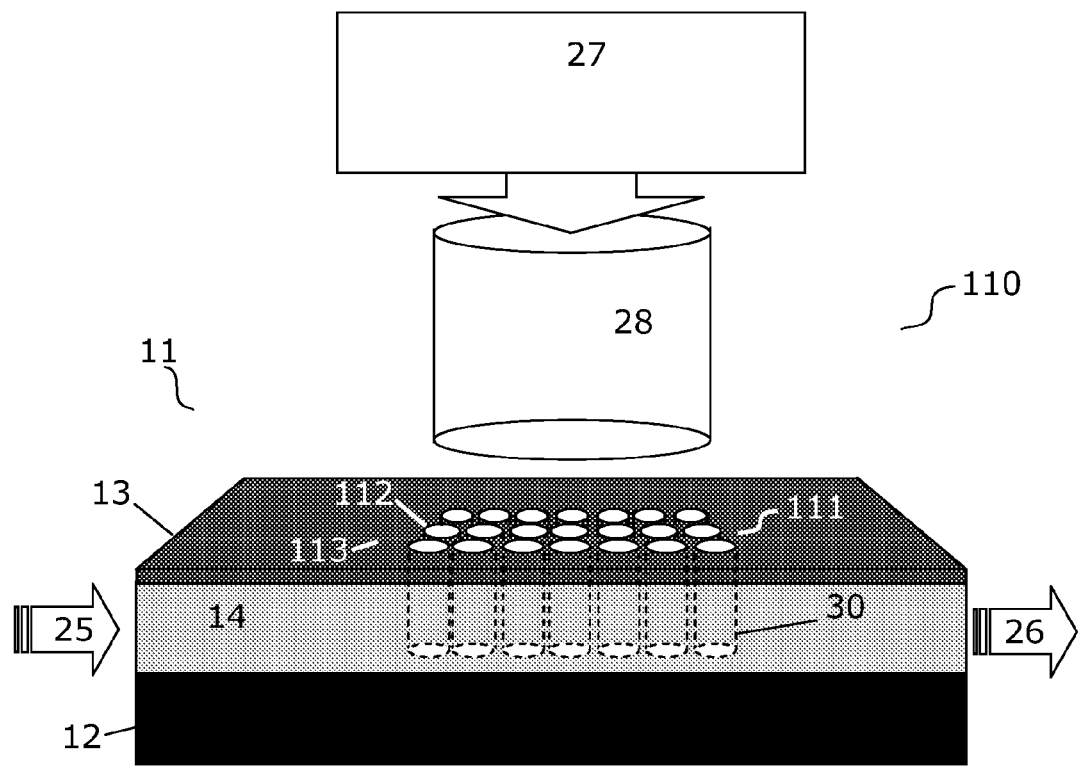
FIG. 11 is a schematic illustration of a system according to an embodiment of the invention.

FIG. 11 illustrates another embodiment of a system 110 for controlling THz radiation in a PPWG according to the invention where the beam shaping element 111 is incorporated into transparent parts of conducting layer 13. Here, the beam shaping element 111 consists of regions 112 that are transparent to optical radiation and other regions 113 (i.e. remaining parts of conducting layer 13) that are not. Regions 1123 and 113 together forms an electrically conducting shadow mask 111 for the optical radiation.

To fabricate the electrically conducting shadow mask 111, a deposited metal layer 13 could be structured through standard photolithographic techniques, with regions 112 of no metal being present on the dielectric. Subsequent uniform deposition of a transparent conducting oxide then covers these regions to define the PPWG. Uniform illumination by an excitation beam 28 on this surface then leads to a patterned excitation columns 30 in the dielectric layer.

In the example shown in FIG. 11, the shadow mask 111 forms a PC structure in the dielectric. By forming regions 111 with other shapes, such as only one region, other patters such as any of those illustrated in FIGS. 5 and 7-9 can be made. The system can provide dynamic control of the THz radiation in the PPWG by temporally modulating the excitation beam.

Example 3

In the following, the experiment of example 2 is described in detail and the performance is analyzed. In this example, modulating the transmission characteristics of a broadband THz pulse within a waveguide is demonstrated using a silicon-filled PPWG where the conducting plates are films of transparent conducting oxide (TCO). The TCO films allow optical modulation of the silicon inside the waveguide by free carrier excitation, changing the transmission properties of the THz pulse as it propagates through the waveguide.

Figure 12:
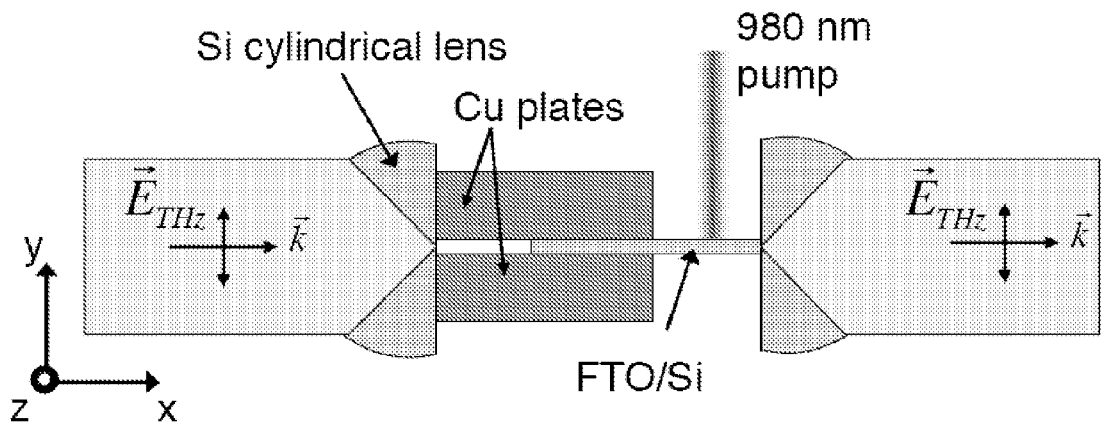
FIG. 12 is a schematic illustration of the setup of an example of the invention.

A schematic of the experimental geometry is shown in FIG. 12 that resides in the focal region of a standard THz time-domain spectrometer based on photoconductive switches triggered by a 70 MHz Ti:sapphire oscillator emitting 50 fs, 800 nm pulses. The waveguide is composed of a 125 µm thick, high resistivity silicon wafer ($\rho$>10,000 ohm-cm) coated on both sides with fluorine-doped tin oxide (FTO), a transparent conducting oxide. The sheet resistivity of the two films was estimated at 7 and 9 ohm/sq, measured by calibrated visible transmission of glass slides present in the chamber and close to the sample at the time of deposition. At a wavelength of 980 nm, this corresponds to a transmission of 72 and 80%, respectively. For the photoconductive experiments, the FTO-coated silicon slab was then placed in a 1.0 cm long hand-polished Cu PPWG, with approximately half of the slab sticking out, as shown in FIG. 12. This arrangement was then inserted between two high resistivity silicon cylindrical lenses with 5 mm radii and focus at the flat surface of the lens, 7.07 mm from the apex, to couple the THz pulse into the planar waveguide.

Figure 13:
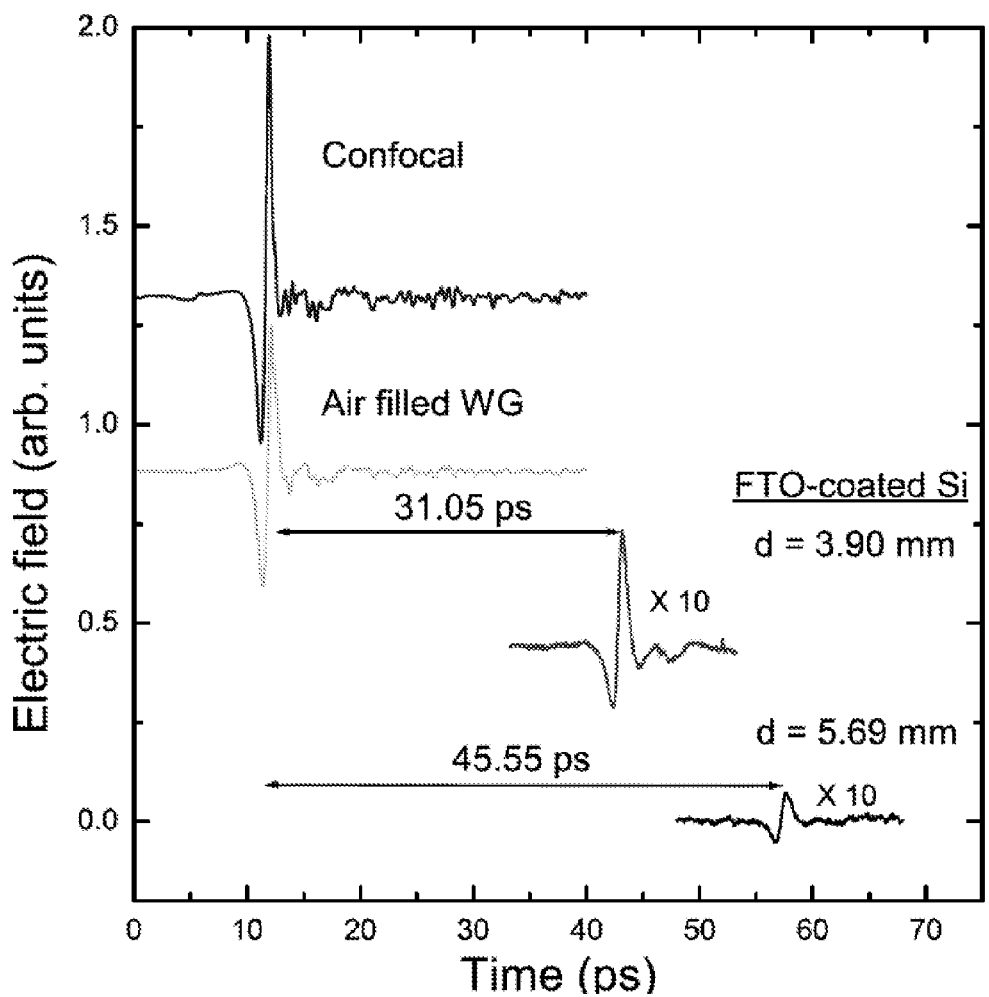
FIG. 13 is a graph showing the measured time domain THz pulses through the Si cylindrical lenses in confocal geometry used in the example of FIG. 12.
Figure 14:
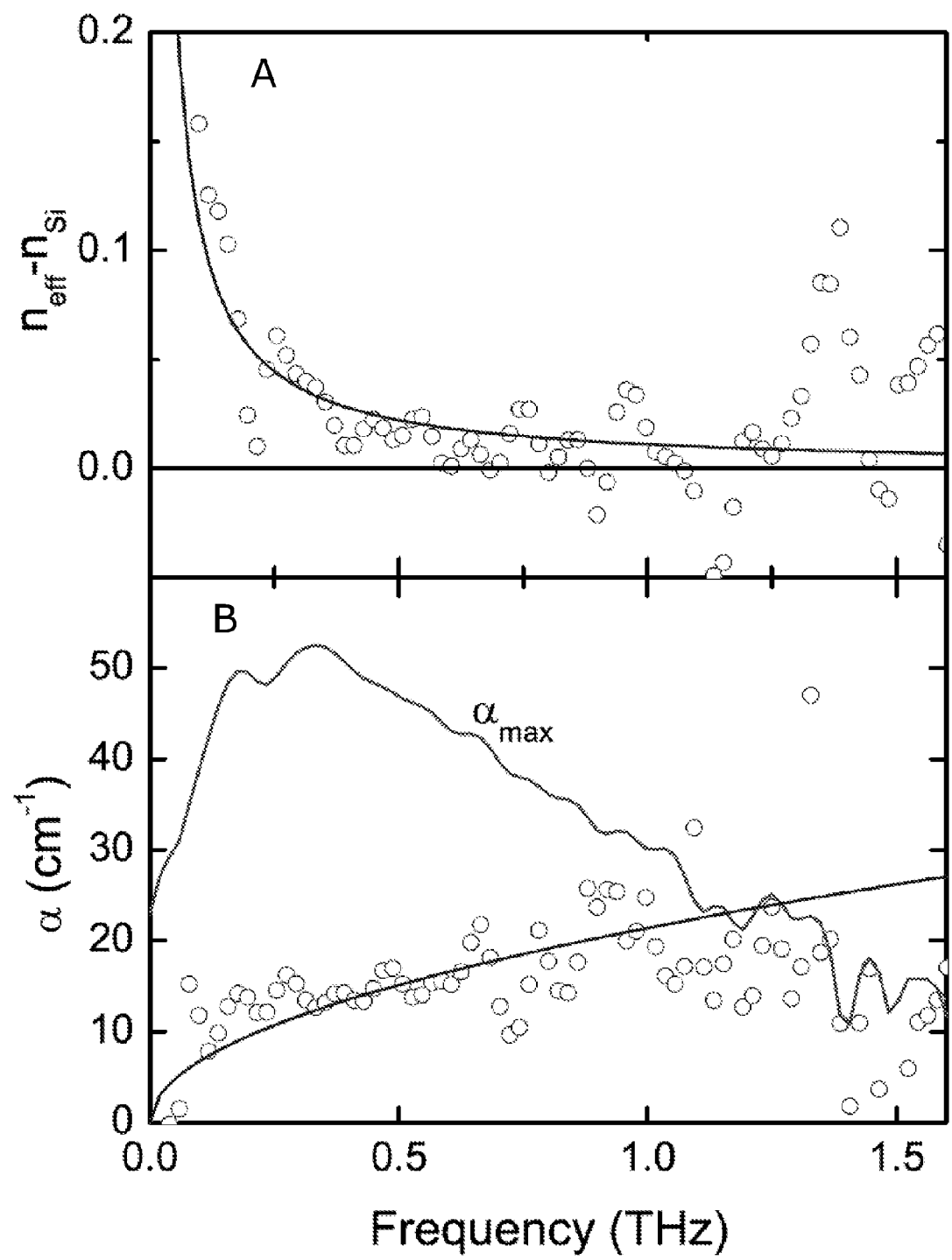
FIGS. 14A and B are graphs showing extracted effective index of refraction and absorption coefficient for the dual FTO coated Si slab used in the example of FIG. 12. The lines are fits to the model described in the text.

We first characterize the intrinsic loss and dispersion of waveguide in the absence of photocarriers. These measurements were performed with the FTO-coated Si completely inside the Cu PPWG. The input THz electric field, polarized along the y-axis, couples only into TM modes, and principally only into the lowest order TEM mode. In the air filled section of the Cu PPWG, the guided TEM pulse has no cutoff frequency and propagates close to c without group velocity dispersion, as shown in FIG. 13 where there is no time delay between the confocal position and the air-filled waveguide and the pulse remains a pulse with very little re-shaping. Inserting a FTO-coated Si slab of length L into the air-filled Cu waveguide, the pulses remain short and are time-shifted roughly by $\Delta t = L/c(n_{Si}-1)$, indicating that the transmitted pulse remains single mode and propagates with only a small amount of group velocity dispersion and a group index close to that of bulk Si. This is expected, as the spatial profile of the TEM mode within the FTO-coated Si waveguide is matched to that of the Cu PPWG, and so avoids exciting higher order even TM modes. The transmitted THz electric field, Eout is given by $$E_{Out} = E_{In} C^2 \exp(-\alpha L/2) \exp(i(\beta-\beta_0)d)) \qquad (1)$$

where $\beta_0$ is the Cu PPWG dispersion constant, close to that of air, $\alpha$ is the power absorption coefficient, $\beta = n_{eff} \omega/c$ is the TCO waveguide dispersion constant and C is the coupling coefficient at the entrance and exit of the WG, assumed to be the same. $n_{eff}$ is the effective waveguide phase index. By measuring the transmission of two FTO coated Si slabs of different length, the power absorption coefficient $\alpha$ and the propagation constant 13 are easily extracted as the contribution of the coupling coefficient can be eliminated. FIG. 14 shows the measured effective index of refraction, $n_{eff}$, minus the Si contribution $n_{Si}$ (FIG. 14A) and $\alpha$ for the TCO waveguide, as well as the maximum detectable absorption, $\alpha_{max}$, from the dynamic range of the measurement (FIG. 14B). For a dielectric filled PPWG with perfect conducting plates, the phase index is constant and equal to the bulk dielectric index, $n_{Si}$. However, the finite conductivity of the plates contributes to a small amount of dispersion, seen in FIG. 13, leading to an increase in $n_{eff}$ at lower frequencies. The waveguide losses, seen in FIG. 14B as ~15 cm$^{-1}$ at 0.5 THz, are relatively high for an optical waveguide but are comparable to transmission lines at these frequencies. Beyond 1.1 THz the absorption data is unreliable, limited by our dynamic range.

The effective index of the waveguide can be related to the conductive losses of the plates by an approximate closed form $$n_{eff} - n_{Si} = C \frac{n_{Si}}{4\omega\sigma_1\mu_0 b^2} \quad (2)$$

where $\sigma_1$ is the conductivity of the plates, and $\mu_0$ is the permeability of free space. Here we have included an additional unit-less scaling factor, C, to quantitatively describe our data, reflecting the fact that this is only an approximation. The losses, characterized by α, are related to the conductivity of the plates by $$\alpha = \frac{n_{Si}}{b}\sqrt{\frac{2\varepsilon_0 \omega}{\sigma_1}} \quad (3)$$

where $\varepsilon_0$ is the permittivity of free space. The measured $n_{eff}$ and α are in good agreement with Equations (2) and (3) given a conductivity of 180 (ωcm)$^{-1}$ and a scaling factor C=29. Here we have ignored dispersion in $\sigma_1$ as reported mobilities of FTO are on the order of 10 cm$^2$/Vs and so the THz bandwidth is within the ωτ<<1 limit where $\sigma_2 << \sigma_1 \approx \sigma_{dc}$. This is a reasonable conductivity for our FTO films, given typical dopant concentrations on the order of 10$^{20}$ cm$^{-3}$ and mobilities of 10 cm$^2$/Vs.

Figure 15:
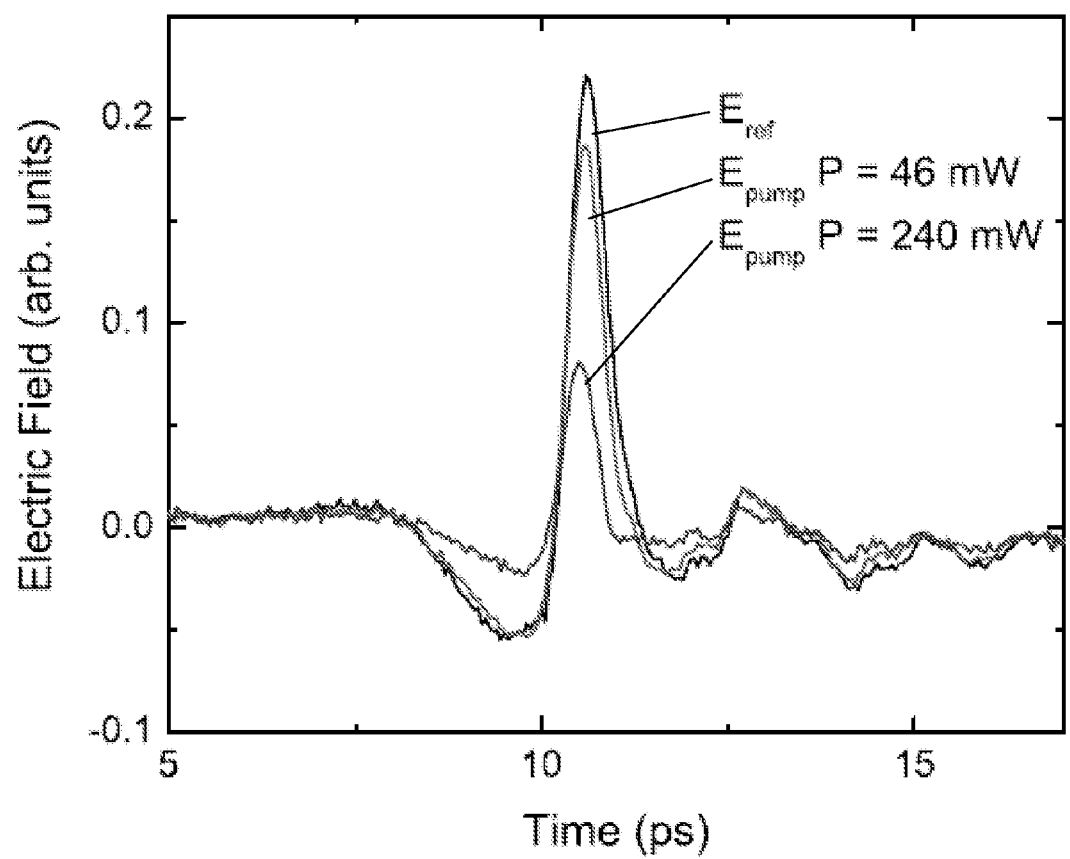
FIG. 15 is a graph showing the measured time domain THz pulses transmitted through the FTO PPWG with and without CW optical excitation at 980 nm in the example of FIG. 12.
Figure 16:
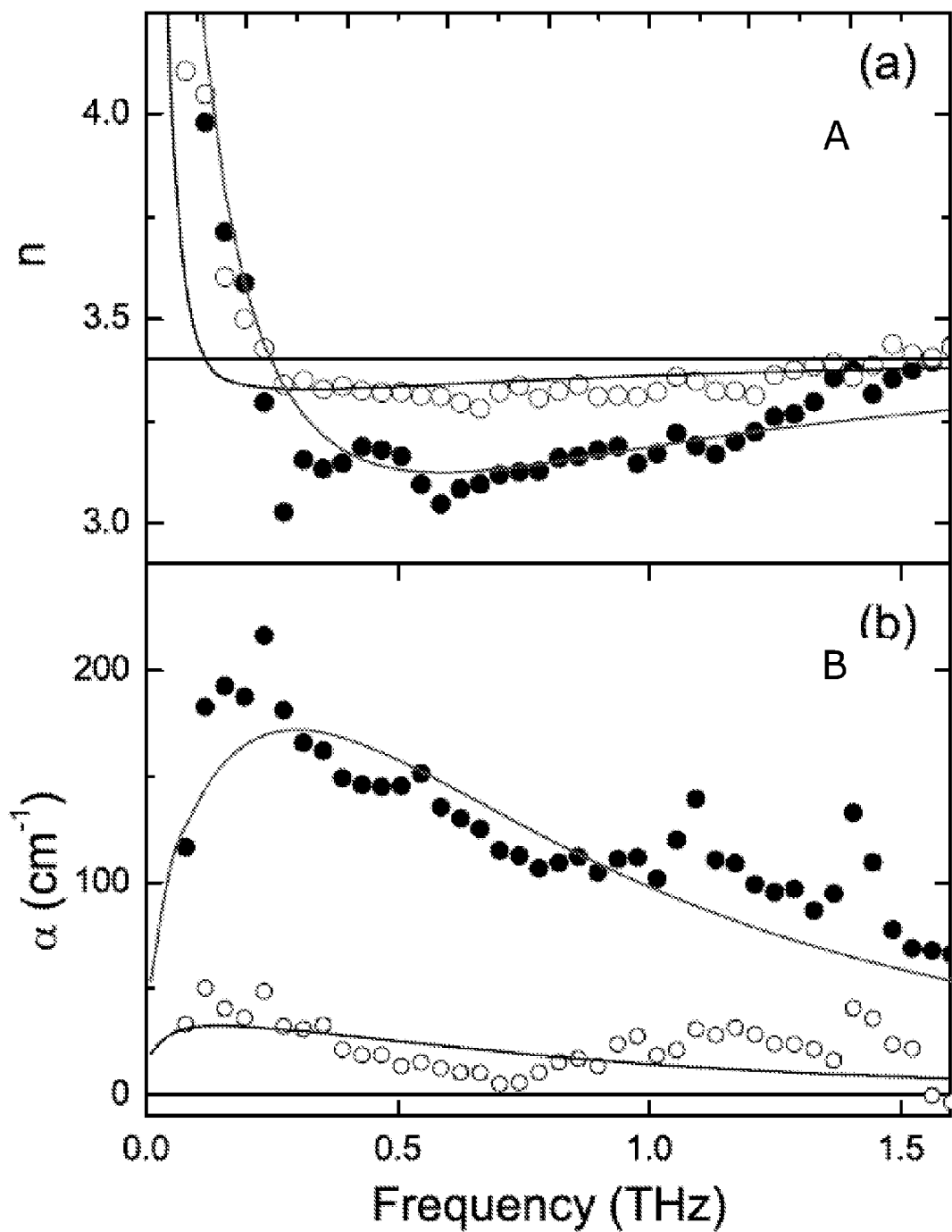
FIGS. 16A and B are graphs showing extracted complex dielectric function of the line excitation within the Si-filled FTO PPWG used in the example of FIG. 12, at $P_{opt}$=46 (filled circles) and 240 mW (open circles). Lines are fits to the Drude model, with parameters given in the text.

Despite the large intrinsic loss of the FTO films, they permit optical excitation of the embedded Si slab and so allow all-optical modulation of the THz pulse within the waveguide. A fiber coupled diode laser operating at 980 nm and providing a tunable output power was used for quasi-CW excitation of the silicon within the PPWG. The pump beam was collimated and then focused to a line, incident on the FTO coated Si slab sticking out of the Cu PPWG as shown in FIG. 12. The line focus was approximately 50 μm along the x-direction, and was ≈3 times greater than the THz spot size in the slab along the z-direction. The penetration depth of 980 nm light in Si is ~85 μm, and so approximately 10% of the light incident on the slab exits the back of the FTO-coated silicon slab, ensuring a uniform excitation. FIG. 15 shows the time domain THz pulses both without ($E_{ref}$) and with an optical excitation, $E_{pump}$, at 46 and 240 mW average power. A strong modulation of the THz pulse transmission is observed, with 70% reduction of the peak electric field at P=240 mW. As the photocarriers are long lived, they are free to diffuse within the x-z plane. Thus there is no sharp photoconductive interface, but rather a gradual onset of conductive region and so we can ignore the Fresnel coefficients at the interface between conducting and non-conducting regions. With this assumption, $E_{pump}$ is related to $E_{ref}$ through the absorption coefficient, α, and the index of refraction, n, by $$E_{pump} = E_{ref} ecp[-\alpha L_D]\exp\left[-i\frac{(n-n_{Si})\omega L_D}{c}\right] \quad (4)$$

where $L_D$ is the diffusion length. Given the Einstein relation, $L_D = \sqrt{\mu_{ab}k_B T \tau_L/e}$ where the ambipolar carrier mobility $\mu_{ab}$ is estimated at 800 cm$^2$/Vs, and a reasonable carrier lifetime, $\tau_L$, of 10 μs, $L_D \approx 140$ μm at room temperature. FIG. 16A gives the extracted n(ω) and X5B the extracted α(ω) for the 240 (solid circles) and 46 mW (open circles) excitations.

The change in the optical constants due to photoexcitation of carriers in silicon is well described by a simple Drude model for the complex conductivity $\sigma(\omega)=\sigma_1(\omega)+i\sigma(\omega)$ of the form $$\sigma(\omega) = \frac{\omega_p^2 \varepsilon_0 \tau}{1 - i\omega\tau} \quad (5)$$

where $\omega_p/2\pi$ is the plasma frequency and τ is the carrier scattering time, presumably that of the electrons because of the higher effective mass of the holes. The predicted change in the index and absorption due to the Drude conductivity is shown in FIGS. 16A and B, respectively. As expected, the measured response is well described by a Drude response given $\omega_p/2\pi$=1.73 and 0.69 THz and a τ of 156 and 180 fs for $P_{opt}$=240 and 46 mW, respectively. As the ratio of the higher to lower optical powers is 5.2 and $\omega_p \propto \sqrt{N}$ we expect the plasma frequency to increase a factor of 2.3, in fair agreement with the measured 2.5 increase in $\omega_p$. Assuming an effective electron mass of 0.26 $m_e$, the associated carrier densities, $N=\omega_p^2 \varepsilon_0 m^*/e^2$, and mobilities, μ=eτ/m*, are 9.65×10$^{15}$ cm$^{-3}$ (1.54×10$^{15}$ cm$^{-3}$) and 1055 cm$^2$/Vs (1220 cm$^2$/Vs) for $P_{opt}$=240 (46 mW), also in agreement with previous work. The carrier density N within the Si slab induced by the optical pump beam can be estimated by $$N = \frac{P_{opt}\tau\lambda(1-\exp(-b/\delta))}{hcL_D bw} \quad (6)$$

where b is the waveguide thickness and w is the 1.1 cm pump beam height along the z-axis. For $P_{opt}$=240 and 46 mW, the corresponding carrier densities are 4.8×10$^{16}$ cm$^{-3}$ and 9.1×10$^{15}$ cm$^{-3}$, respectively. This is within an order of magnitude of the extracted carrier densities from the measured plasma frequencies, which is reasonable considering the uncertainty in carrier lifetimes, spatial distribution and photon to mobile carrier conversion efficiency. The demonstrated agreement with Drude theory and good quantitative agreement in calculated carrier densities and mobility to calculations and previous work demonstrate that the modulation of the THz pulse is due to a photo-induced mobile charge carrier population. Thus we have demonstrated a technique for all optical modulation of a THz pulse within a planar waveguide.

In conclusion, we have demonstrated a novel optically transparent dielectric filled PPWG for active terahertz photonic applications. The transmission of the THz pulse can be modulated by optical excitation of free carriers in a silicon slab through the transparent conducting films defining the waveguide. The high loss of the TCO plates can be managed by reducing the length of the active in-line section to <500 μm, with high conductivity metallic coatings in between or by increasing the conductivity of the TCO films while maintaining their optical transmission.

Example 3

Reduction of Losses

The structure described in the above in relation to FIG. 12 has been improved to reduce losses. The reduced losses are achieved by using thin film PPWG composed of a thin, b=100 µm thick high resistivity silicon wafer, coated on one side with 280 nm of Au with a 2 nm thick Ti adhesive layer, and on the other side a 1.6 µm thick fluorinated tin oxide (FTO) coating. The thin film PPWG is embedded in another hand-polished aluminium PPWG and bridges an access port in one of the Al plates, allowing optical excitation of the underlying Si through the FTO coating.

The 1.6 µm thick FTO coating allows ~20% transmission of 1 µm wavelength light and exceeds the skin depth of the THz pulse, approximately 1.1 µm for a typical FTO film conductivity of ~2000 (Ω cm)$^{-1}$. This, combined with replacing one of the FTO films with high conductivity Au to form an asymmetric PPWG, reduces the loss greatly.

Figure 17:
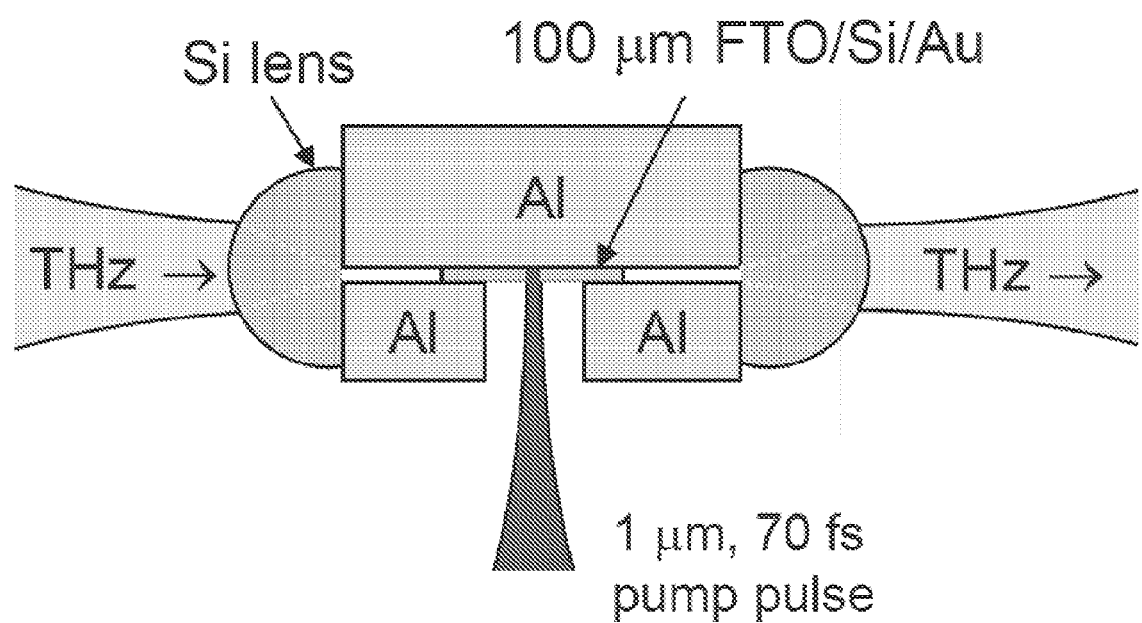
FIG. 17 is a schematic illustration of the setup of an example of the invention.

A schematic of the experimental geometry is shown in FIG. 17 that resides in the focal region of a typical time domain THz pulse spectrometer, driven by a 1 kHz repetition rate, Ti:sapphire femtosecond laser amplifier system delivering 3.5 mJ, sub-50 fs pulses. The THz pulses are coupled into and out of the PPWG assembly by two cylindrical Si lenses. The polarization of the THz pulse is TM, to couple into the dispersionless $TM_0$ mode of the PPWG.

A 1 µm, 70 fs pump pulse of light is generated by an optical parametric amplifier and is incident on the FTO side of the coated Si wafer. The pulsed light beam is focused using a cylindrical lens. The penetration depth of 1 µm light in Si is approximately 100 µm, and combined with the back-reflected light off the Au coating results in a uniform illumination through the wafer.

Figure 18:
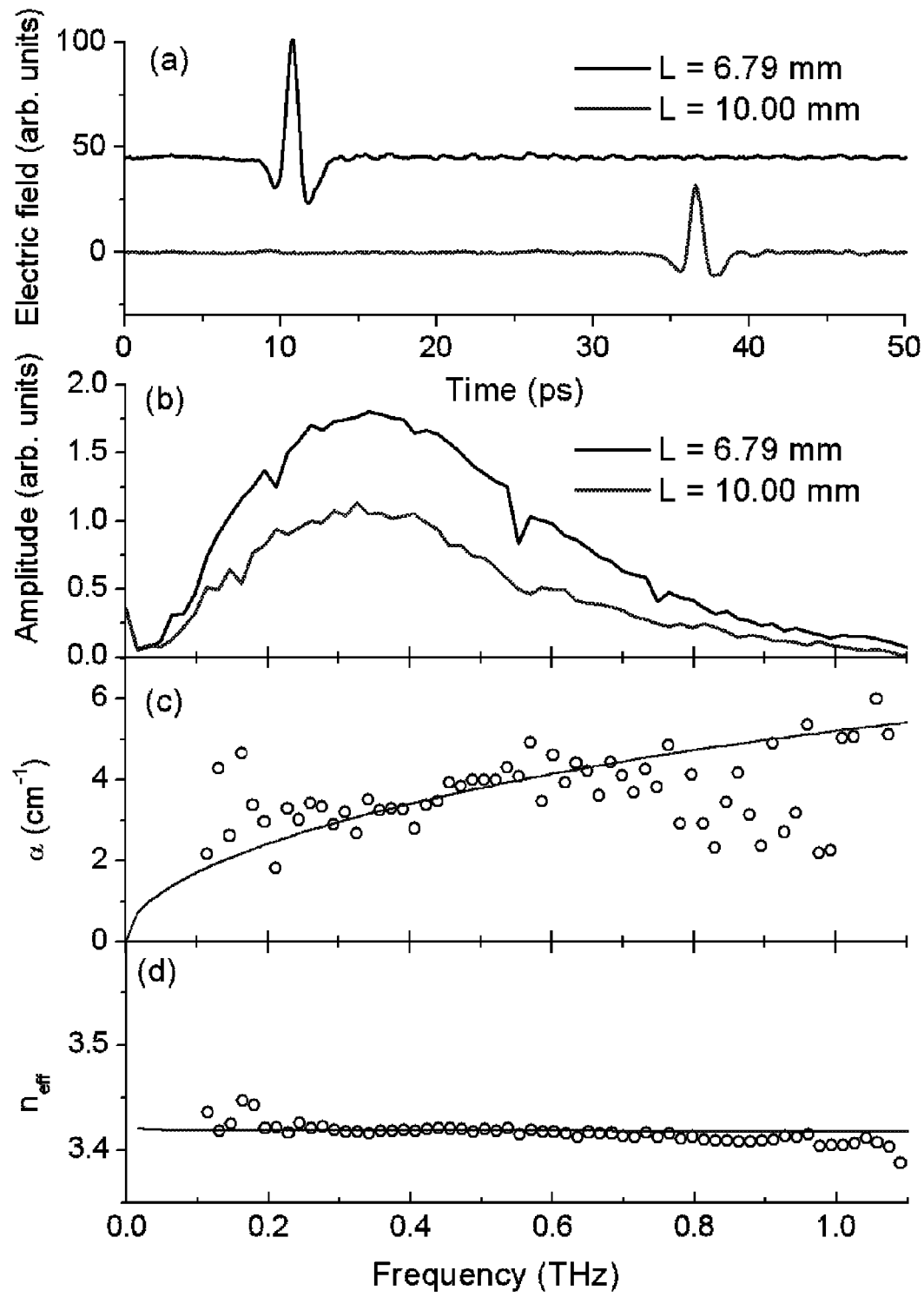
FIG. 18 are graphs showing measured characteristics of the example of FIG. 17.

To characterise the loss and dispersion of the waveguide a cutback experiment was performed. The transmitted THz pulses through PPWGs of length L=6.79 and 10.0 mm are shown in FIG. 18(a), The transmitted THz pulse shifts in time by 25.8 ps as the thin film PPWG is elongated by 3.21 mm, corresponding to the expected index of refraction of Si, $n_{Si}$=3.41. The Fourier amplitude spectrum for the time domain data in FIG. 18(a) is given in FIG. 18(b), showing a smooth spectrum with no visible cut-offs, despite the first cut-off frequency for the waveguide being at 0.44 THz, and indicating the THz pulse propagates in the dispersionless TEM mode. This is expected due to the perfect TEM mode matching from the encasing Al PPWG.

A good approximation is that the contribution to the absorption and dispersion from the Al waveguide could be negligible. Therefore can α and the effective waveguide index, $n_{eff}$, be extracted from the waveforms in FIG. 18(a). The ratio of the transmitted fields is given as $$\frac{E(\omega, L_1)}{E(\omega, L_2)} = e^{-\alpha \Delta L/2} e^{i(n_{eff}-1)\omega \Delta L/c} \quad (7)$$

where $\Delta L=L_1-L_2$, $L_1$=10.00 mm and $L_2$=6.79 mm. The extracted α is shown in FIG. 12(c), showing a loss coefficient of approximately 4 cm$^{-1}$ at 1 THz. The absorption is well described by dissipation of surface currents in the FTO coating of the form $$\alpha = \frac{n_{Si}}{\sigma_{FTO}\delta_0 Z_0 b} \quad (8)$$

where $\sigma_{FTO}$ is the real conductivity of the FTO coating, $\delta_0$ is the skin depth of the THz field into the FTO film, $Z_0$ is the impedance of free space and b is the 100 µm spacing of the PPWG. We note this is half the usual absorption in a PPWG since only one plate is FTO and we are neglecting the loss due to the Au plate.

Eqn. 8 describes the observed absorption coefficient, with the fitted $\sigma_{FTO}$=1100 (Ω cm)$^{-1}$ that corresponds to a $\delta_0$ of 1.4 µm, less than the 1.6 µm thickness of the FTO film and in good agreement with reported dc conductivities of FTO. From the phase information of the pulses in FIG. 18(a), the extracted $n_{eff}$ is shown in FIG. 18(d) and is a nearly dispersionless $n_{eff}$=3.41. The slight upturn of $n_{eff}$ as ω→0 is more than the expected dispersion due to the conductivity of the FTO film, shown as a solid line in FIG. 18(d), and is likely due to the lowest frequencies $\delta_0$ exceeds the FTO film thickness, causing field leakage and further dispersion.

The device loss power coefficient was reduced from 15 cm$^{-1}$ to 4 cm$^{-1}$ at 1 THz, or an improvement of 48 dB/cm. This was accomplished mainly by forming an asymmetric waveguide with only one of the plates being a TCO and the other a high conductivity gold film that contributes very little to the loss, and optimizing the thickness of the TCO layer (1.6 µm) to exceed the skin depth of the THz radiation (1.1 µm at 1 THz) for most of the pulse bandwidth. The asymmetric waveguide decreases α by a factor of 2, and the remaining reduction of 3.5 cm$^{-1}$ is due to the thicker TCO layer.

Example 4

In example 4, a technique to induce a reflective element capable of steering the pulse within the waveguide is demonstrated and the concept is verified using finite element simulations.

A thin film PPWG is fabricated by coating a 100 µm thick high resistivity silicon wafer (ρ>10,000 Ω-cm) on one side with 300 nm of Au with a 2 nm Ti adhesion layer, and the other side with 1.6 µm of fluorinated tin oxide (FTO), a transparent conducting oxide. The static transmission properties have previously been reported, with power absorption coefficients of 4 cm$^{-1}$ at 0.5 THz and practically no dispersion across the THz bandwidth.

Coupling into and out of the thin film waveguide is achieved through a second Al parallel plate waveguide using the thin film PPWG as a spacer, and shown in FIG. 19(a) without the front plate for clarity. A 5×5 mm hole is cut in the front Al plate to allow optical access to the FTO side of the thin film PPWG, which bridges the hole. The waveguide assembly sits in the focal region of a typical terahertz time-domain spectrometer (THz-TDS), based on optical rectification for THz generation in a 1 mm thick ZnTe crystal and detected by free-space electro-optic detection in a second 0.5 mm thick ZnTe crystal.

The 45 fs duration, 1 kHz repetition rate, output from an amplified fs Ti:sapphire laser system is split into three beams, one used as a source beam for THz pulses, and a second as a gating beam for THz detection. A third beam is used to pump an optical parametric amplifier to frequency convert the 800 nm fundamental to 1030 nm by second harmonic generation of the idler. The reason for this frequency conversion is to provide a uniform excitation profile through the thickness of the slab, as the optical penetration depth for 1030 nm wavelength light in silicon is approximately 100 microns. The average power of the pump beam was 2.5 mW before the FTO coating, which transmits approximately 20% of the 1030 nm pump.

The pump beam is focused to a 2 mm long (1/e$^2$) line by a 30 cm cylindrical lens with focal position located at the thin film PPWG. The beam waist of the resulting line is approximately 32 microns, calculated by Gaussian beam optics. The cylindrical lens is oriented such that the line excitation is 45 degrees to the incoming THz pulse, and parallel to a diced edge in the thin film PPWG. Care was taken to achieve a perpendicular edge, as any wedge can lead to coupling to lossy, higher order modes.

The THz beam is partially incident on the diced slab edge, such that the lower part of the beam is transmitted straight to the detector (pulse 1) and the upper part of the beam is reflected downwards in the slab (pulse 2) by total internal reflection (TIR) as shown in FIG. 19(b). If the pump pulse is present, the created charge carrier profile can induce a reflection that redirects the downward travelling pulse 2 towards the detector, which appears delayed by several ps with respect to the pulse 1. The line focus is vertically displaced by an amount $\Delta y$ (See FIG. 19(b)) in the plane by rotation of the vertical adjustment of a mirror following the cylindrical lens in steps of ⅛ of a rotation, and then calculating the displacement by the 80 turns per inch motion of the screw, knowing the distance of the screw to the pivot point of the mirror. The delay of pulse 2 is then expected to increase linearly with $\Delta y$ if it is caused by a reflection from the pump line excitation within the waveguide, due to the longer path length taken inside the slab to the detector, as depicted in FIG. 19(b). As pulse 1 is transmitted through the line focus directly to the detector, its arrival time is unaffected by the motion of the line focus.

Figure 19:
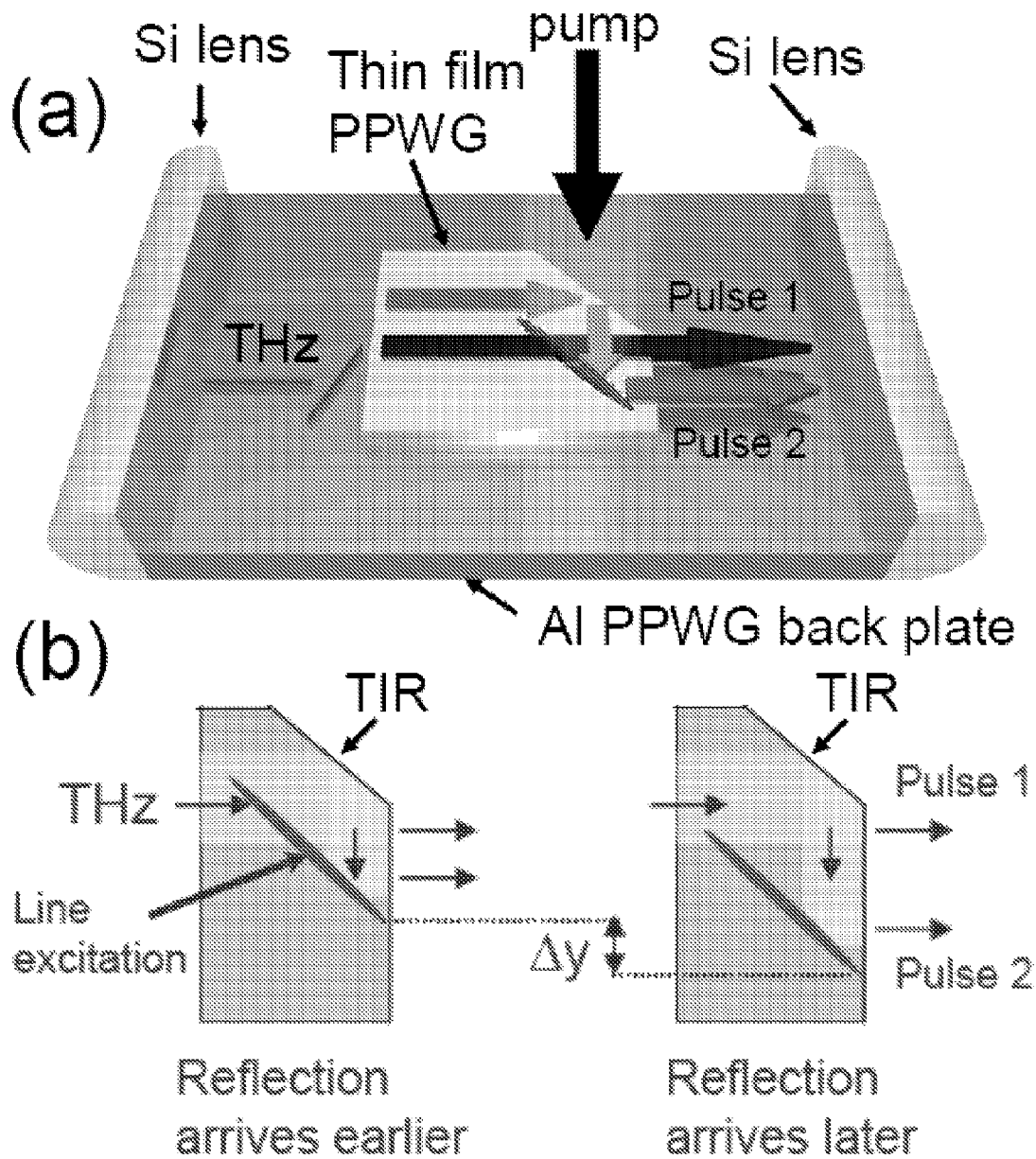
FIG. 19 is a schematic illustration of the setup of an example of the invention.
Figure 20:
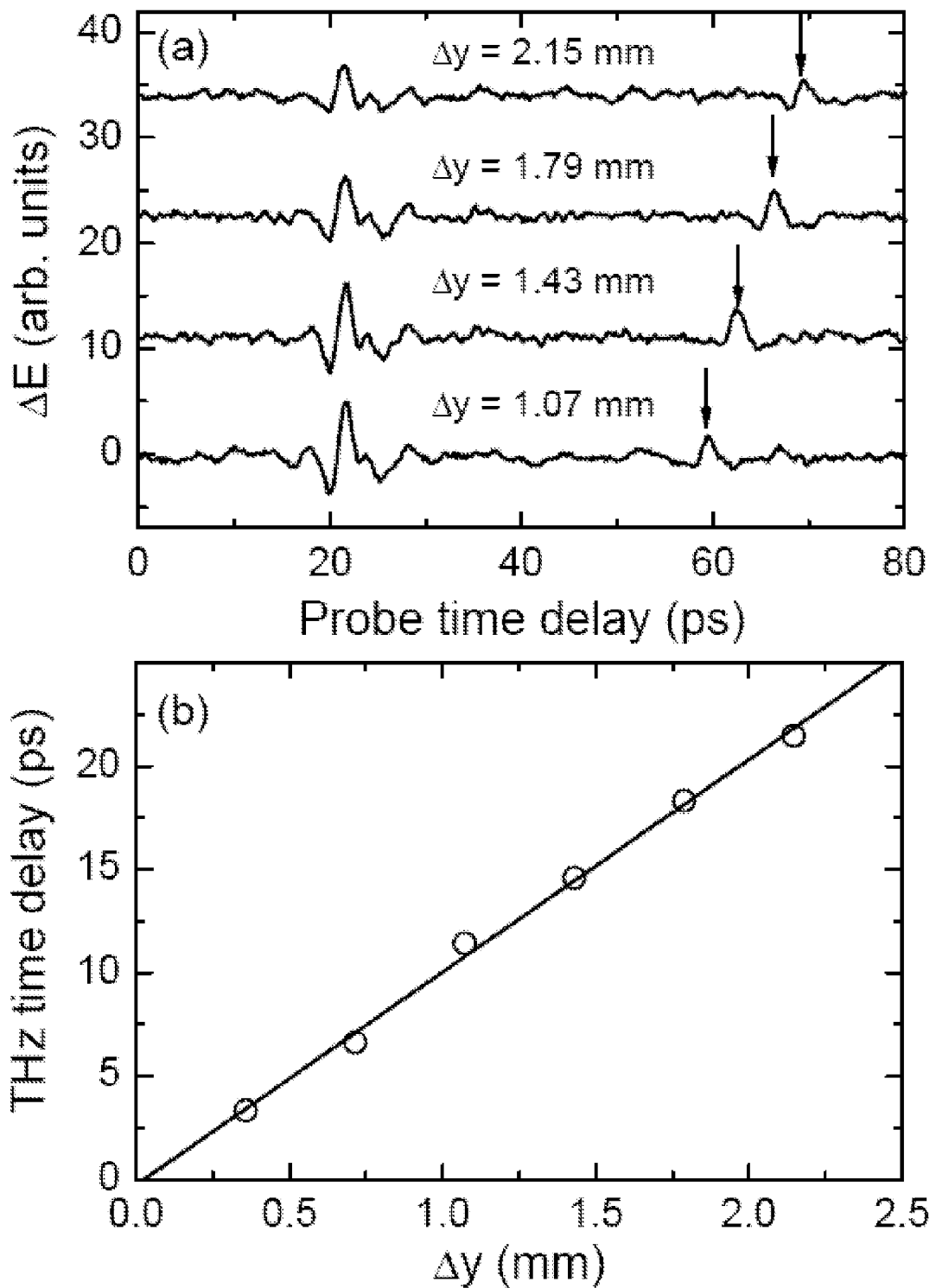
FIGS. 20 and 21 are graphs showing measured characteristics of the example of FIG. 19.

FIG. 20(a) shows the experimental results, mechanically chopping the optical pump beam so that only the pump-induced modulation, $\Delta E = E_{unpumped} - E_{pumped}$, of the detected THz pulses are measured. Two modulated pulses are observed, an earlier pulse whose arrival time at the detector is unaffected by the vertical displacement of the pump beam, and a second pulse which is increasingly delayed with increasing $\Delta y$. The earlier pulse is simply the THz pulse transmitted directly to the detector, modulated by transmission through the line focus (pulse 1 in FIG. 19). The amplitude of the modulation of pulse 1 decreases as $\Delta y$ increases because the finite length of the line focus overlaps less with the directly transmitted path of pulse 1, as expected by the geometry outlined in FIG. 19. The two pulses are in phase with respect to one another, as no phase shift is expected for the total internal reflection of light polarized perpendicular to the plane of reflection.

The arrival time of pulse 2 is plotted in FIG. 20(b) and is linear with $\Delta y$, as is expected for the reflected geometry in FIG. 19. The expected time delay is given by $\Delta t = n_{Si}\Delta y/c$, where $n_{Si}$ is the index of refraction of Si at THz frequencies (3.42). A linear fit of this equation to the data is shown in FIG. 20(b), yielding $n_{Si}$=3.05, 10% lower than the expected 3.42. A possible source of this discrepancy is the walkoff induced by the reflection as the line focus is moved downwards, changing the timing of the detection to earlier times. Furthermore, the detection of pulse 2 was found to be extremely sensitive to the angle of the line focus with respect to the diced edge. This, combined with the linear time shift of the second pulse with $\Delta y$ is a clear signature of an induced reflection changing the propagation direction of the THz pulse within the slab, and is the first demonstration of optically-controllable THz beam steering in a planar waveguide.

Figure 21A:
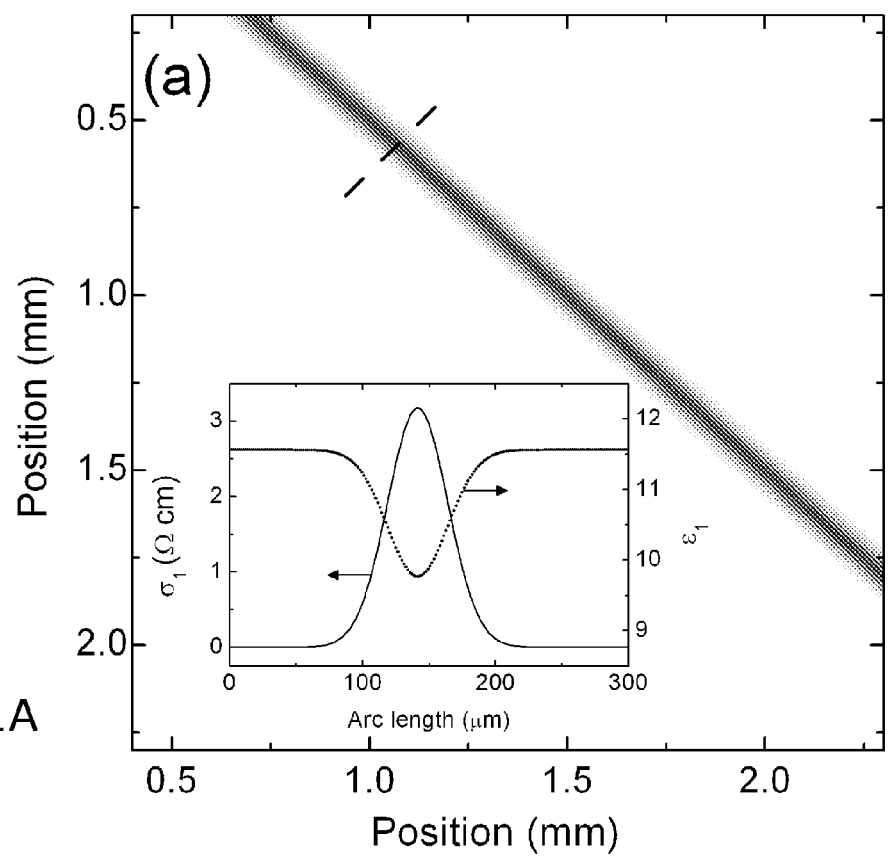

A two-dimensional finite element simulation using the harmonic solver of the commercially available COMSOL software package is shown in FIG. 21, for a 0.5 THz TM polarized plane wave incident on a line of conducting region in silicon, defined as a Gaussian profile $\sigma(r) = \sigma_0 \exp[-(r/w)^2]$ where $\sigma_0$ is the peak conductivity and r is the perpendicular coordinate from the line direction. FIG. 21(a) shows the 2D conductivity plot used in the simulation, tilted by 45° relative to the incoming wave. Variable meshing was used to ensure that the skin depth of the excitation was sufficiently meshed. The Gaussian waist, w, was 32 microns to match experimental conditions. The form of conductivity is assumed to be a Drude form, and both real and imaginary components are taken into account with a scattering time of 50 fs, typical of photoexcited Si at room temperature. The inset of FIG. 21(a) is a perpendicular slice across the line excitation, indicated by the dotted line in the plot, of the real parts of the conductivity and dielectric function at the 0.5 THz plane wave frequency.

Figure 21B:
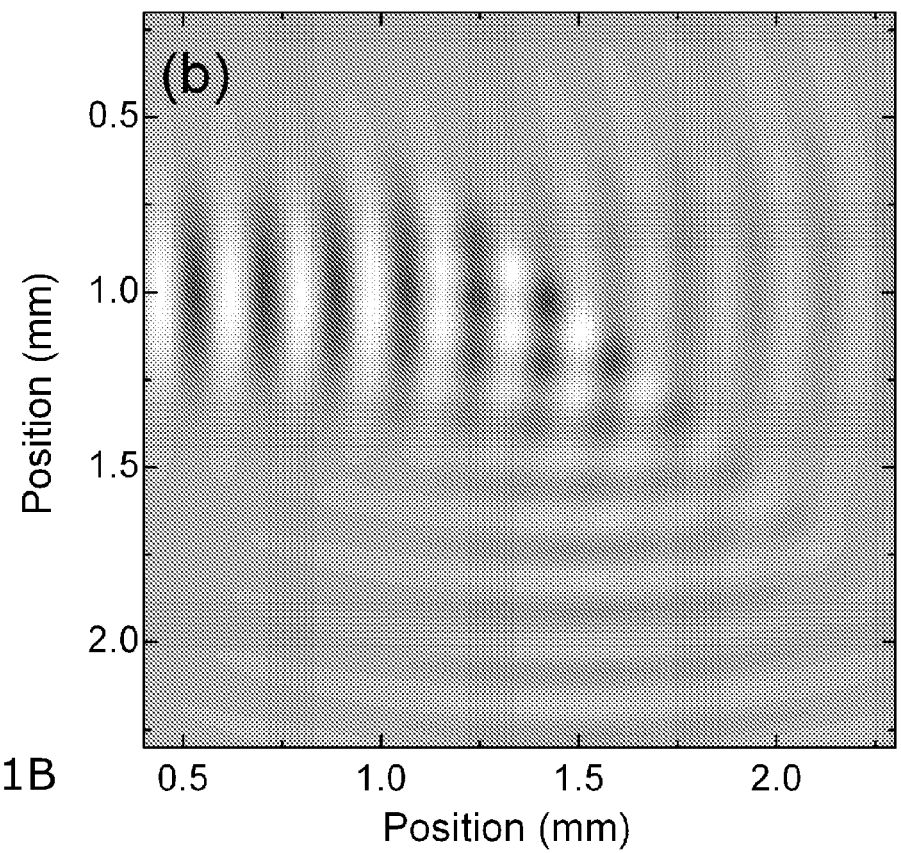
Figure 21C:
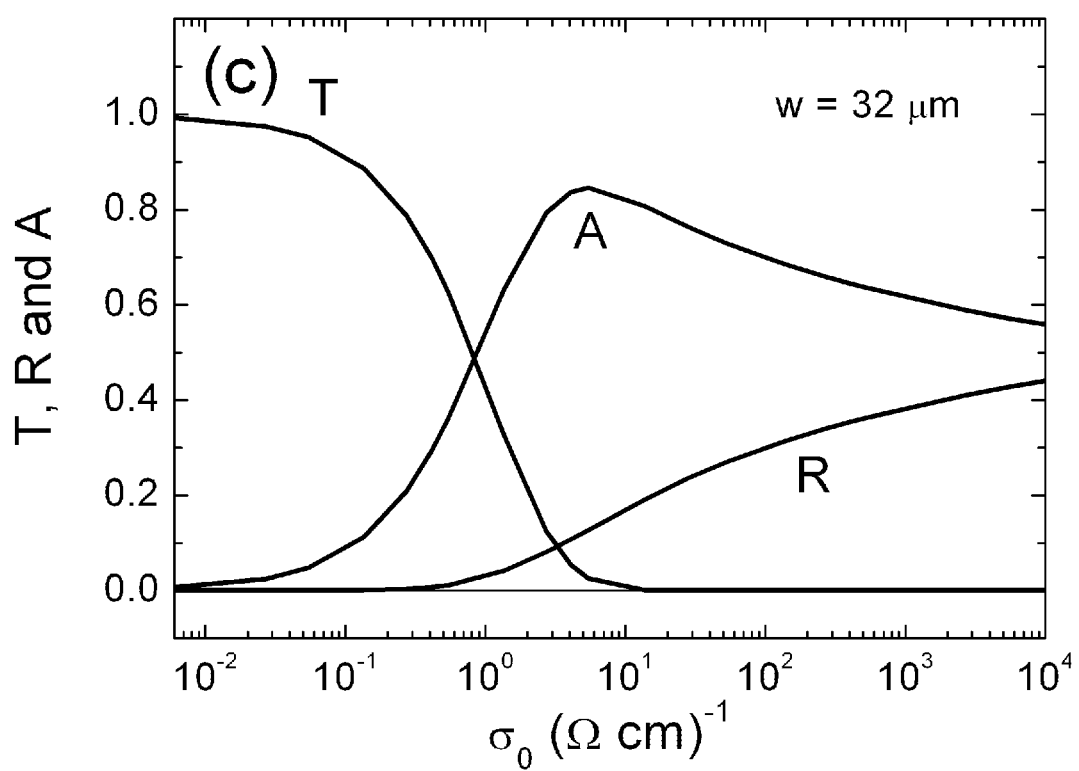

FIG. 21(b) shows the solved z-component of the electric field, for a $\sigma_0$ value that gives equal transmission and reflection of the incident field and verifies that a reflection is indeed possible by a 2D Gaussian conductivity profile in Si. The extent of the transmission and reflection depends on $\sigma_0$ and w, as well as the frequency of the plane wave. FIG. 21(c) plots the power coefficients of transmission (T), reflection (R) and absorption (calculated as A=1−T−R) versus peak conductivity $\sigma_0$. We note that in our experiment we estimate $\sigma_0$=10 $(\Omega cm)^{-1}$ from our pump fluence, corresponding to a 1% transmission and a 17% reflection of power according to the simulation in FIG. 21(c). These numbers serve only as a guide, however, since in the experiment the pump beam was of finite length and it was impossible to know the overlap between the THz beam and the pump beam. It is therefore likely that the transmitted pulse 1 sees a region of lower conductivity, and therefore transmits more. From FIG. 21(c), it is promising that a >30% reflection of the power is achievable with $\sigma_0$>100 $(\Omega cm)^{-1}$, requiring pulses of energy >1 μJ pulses which could be provided from commercially available ytterbium-based fibre lasers as opposed to an amplified Ti:sapphire laser system used here.

In summary, an optically-induced reflective THz quasi-optics inside a parallel plate waveguide has been demonstrated and shown a beamsplitter as a simplified proof of principle. The technique relies on the creation of spatially well defined carrier profiles within the transparent waveguide that are sufficiently conducting to lower the skin depth of the radiation to less than that of width of the profiles. Finite element calculations has shown that reflection coefficients greater than 30% can be achieved with conventional focusing optics well above the diffraction limit of the 1030 nm pump beam. These dynamic quasi-optics can be switched on with a speed limited by the duration of the excitation pulse, and are reconfigurable on time scales determined by the lifetime of carriers in the semiconductor.

Although the present invention has been described in connection with the specified embodiments, it is not intended to be limited to the specific form set forth herein. Rather, the scope of the present invention is limited only by the accompanying claims. In the claims, the term "comprising" does not exclude the presence of other elements or steps. Additionally, although individual features may be included in different claims, these may possibly be advantageously combined, and the inclusion in different claims does not imply that a combination of features is not feasible and/or advantageous. In addition, singular references do not exclude a plurality. Thus, references to "a", "an", "first", "second" etc. do not preclude a plurality. Furthermore, reference signs in the claims shall not be construed as limiting the scope.

REFERENCES

"Undistorted guided-wave propagation of subpicosecond THz pulses", Mendis et. al, Opt. Lett. 26, 846 (2001).
"THz parallel plate photonic waveguides", Bingham et. al, Appl. Phys. Lett. 87, 051101 (2005)
US 2005/058166 .

The invention claimed is:

1. A system for controlling Terahertz (THz) radiation in a parallel plate waveguide (PPWG), comprising:
   a THz PPWG comprising parallel first and second electrically conducting layers and a semiconductor layer disposed between the first and second conducting layers, wherein one or more parts of one of the conducting layers is transparent to optical radiation;
   an optical radiation source for generating an excitation beam for irradiating the semiconductor layer through the transparent conducting layer parts, the optical radiation being capable of generating free charge carriers through the entire thickness of the semiconductor layer; and
   one or more beam shaping elements for controlling the excitation beam to create a photo-induced pattern of charge carriers in the semiconductor layer for controlling THz radiation propagating in the PPWG; wherein the optical radiation source and beam shaping means are configured to generate transient photo-induced patterns by providing the excitation beam irradiating the semiconductor layer in a pulsed manner with a maximum pulse length $t_{pump}$ of 50 μs.

2. The system according to claim 1, wherein the transient photo-induced pattern forms a line in the semiconductor layer to make a mirror in the PPWG.

3. The system according to claim 1, wherein the transient photo-induced pattern forms a photonic crystal structure in the PPWG for THz radiation propagating in the PPWG.

4. The system according to claim 1, wherein the semiconductor layer is modified to obtain a free carrier lifetime, τ, smaller than 10 μs and/or a diffusion length, $L_D$, smaller than 250 μm.

5. The system according to claim 1, wherein a beam shaping element is integrated in the PPWG as transparent parts of one of the conducting layers.

6. The system according to claim 1, wherein the thickness of the semiconductor layer $D_{SL}$ in the PPWB is equal to or less than 100 μm.

7. The system according to claim 1, wherein the transient photo-induced pattern forms a first and second reflectors for THz radiation in the semiconductor layer, and wherein the beam shaping elements are configured to move these in relation to each other to form a delay line.

8. The system according to claim 1, wherein the transparent conducting layer parts are formed by transparent conducting oxides having a thickness larger than a skin depth of the THz radiation.

9. The system according to claim 1, further comprising a control circuit for controlling the one or more beam shaping elements to control the THz radiation in response to a received electrical control signal or optical control signal.

10. The system according to claim 9, further comprising a synchronization unit for locking the repetition rate of the optical radiation source to a received clock signal indicative of the repetition rate of THz pulses and adjust a delay between excitation beam pulses with the THz pulses.

11. The system according to claim 1, wherein the system is integrated in a chip-scale active component.

12. A method for designing a system according to claim 1, the method comprising:
   selecting a material composition and a thickness of the transparent conducting layer parts to provide confinement of THz radiation in the semiconductor layer for a desirable wavelength of the THz radiation; and
   selecting the material composition and a thickness of the semiconductor layer and a wavelength and an intensity of the excitation beam to allow excitation of charge carriers through the entire thickness of the semiconductor layer, wherein the selected material composition and thickness of the transparent conducting layer parts is further selected to provide a transparency of the transparent conducting layer parts of for the excitation beam.

13. A method for controlling Terahertz (THz) radiation in a parallel plate waveguide (PPWG), comprising:
   providing a THz PPWG comprising parallel first and second electrically conducting layers and a semiconductor layer disposed between the first and second conducting layers, wherein one or more parts of one of the conducting layers is transparent to optical radiation;
   propagating THz radiation in the PPWG; and
   irradiating the semiconductor layer through the transparent conducting layer parts with an excitation beam of optical radiation in a pulsed manner with a maximum pulse length of $t_{pump}$ 50 μs to create a transient photo-induced pattern of charge carriers through the entire thickness of the semiconductor layer to control the THz radiation.

14. A system for controlling Terahertz (THz) radiation in a parallel plate waveguide (PPWG), comprising:
   a THz PPWG comprising parallel first and second electrically conducting layers and a photorefractive dielectric layer disposed between the first and second conducting layers, wherein one or more parts of one of the conducting layers is transparent to optical radiation;
   an optical radiation source for generating an excitation beam for irradiating the dielectric layer through the transparent conducting layer parts to change the real part of the refractive index of the dielectric layer in the THz regime by the photorefractive effect through the entire thickness of the dielectric layer; and
   one or more beam shaping elements for controlling the excitation beam to create transient photo-induced pattern excitation in the dielectric layer for controlling THz radiation propagating in the PPWG.

15. A method for controlling Terahertz (THz) radiation in a parallel plate waveguide (PPWG), comprising:
   providing a THz PPWG comprising parallel first and second electrically conducting layers and a photorefractive dielectric layer disposed between the first and second conducting layers, wherein one or more parts of one of the conducting layers is transparent to optical radiation;
   propagating THz radiation in the PPWG; and
   irradiating the dielectric layer through the transparent conducting layer parts with an excitation beam of optical radiation to create a transient change in the real part of the refractive index of the dielectric layer in the THz regime by the photorefractive effect through the entire thickness of the dielectric layer to control the THz radiation.

* * * * *

UNITED STATES PATENT AND TRADEMARK OFFICE
CERTIFICATE OF CORRECTION

| | | |
|---|---|---|
| PATENT NO. | : 8,433,170 B2 | Page 1 of 1 |
| APPLICATION NO. | : 13/000773 | |
| DATED | : April 30, 2013 | |
| INVENTOR(S) | : David Gregory Cooke | |

It is certified that error appears in the above-identified patent and that said Letters Patent is hereby corrected as shown below:

On the Title page, References Cited

At Page 2, Item 56, Column 1, Line 13, Under Other Publications, change "Zenhnder" to --Zehnder--.

In the Specifications

Column 3, Line 44, Change "Where" to --where--.

Column 9, Line 37, Change "PPWG" to --PPWG.--.

Column 9, Line 60, Change "nobiate" to --niobate--.

Column 10, Line 41, Change "there" to --their--.

Column 11, Line 12, Change "of" to --off--.

Column 11, Line 58, Change "ultra short" to --ultrashort--.

Column 17, Line 26-27, Change "collimater" to --collimator--.

In the Claims

Column 25, Line 26, In Claim 2, change "minor" to --mirror--.

Signed and Sealed this
Seventh Day of January, 2014

Margaret A. Focarino
*Commissioner for Patents of the United States Patent and Trademark Office*